United States Patent [19]

Asaba et al.

[11] Patent Number: 5,547,708
[45] Date of Patent: Aug. 20, 1996

[54] CHEMICAL VAPOR DEPOSITION METHOD FOR FORMING A DEPOSITED FILM WITH THE USE OF LIQUID RAW MATERIAL

[75] Inventors: Tetsuo Asaba, Odawara; Kenji Makino, Yokohama, both of Japan

[73] Assignee: Canon Kabushiki Kaisha, Tokyo, Japan

[21] Appl. No.: 339,887

[22] Filed: Nov. 14, 1994

Related U.S. Application Data

[62] Division of Ser. No. 997,543, Dec. 28, 1992, Pat. No. 5,383,970.

[30] Foreign Application Priority Data

Dec. 26, 1991 [JP] Japan ................................ 3-345056

[51] Int. Cl.⁶ .................................................. C23C 16/00
[52] U.S. Cl. .................. 427/248.1; 427/250; 427/252; 427/255.1; 427/255.2; 427/255.3
[58] Field of Search ............................... 427/250, 248.1, 427/252, 255.1, 255.2, 255.3

[56] References Cited

U.S. PATENT DOCUMENTS

| | | | |
|---|---|---|---|
| 668,953 | 2/1901 | Dawson | 261/156 |
| 846,679 | 3/1907 | Mason | 261/156 |
| 959,950 | 5/1910 | Loose | 261/156 |
| 977,066 | 11/1910 | Blom | 261/156 |
| 979,409 | 12/1910 | Barker | 261/156 |
| 1,122,703 | 12/1914 | Dull | 261/156 |
| 1,160,585 | 11/1915 | Edison | 261/156 |
| 1,202,771 | 10/1916 | Babbitt | 261/156 |
| 1,965,144 | 1/1934 | Kane | 261/156 |
| 3,969,449 | 7/1976 | Shires | 261/156 |
| 4,276,243 | 6/1981 | Partas | 261/128 |
| 4,823,734 | 4/1989 | Christin | 118/719 |
| 4,993,361 | 2/1991 | Unvala | 118/715 |
| 5,151,305 | 9/1992 | Matsumoto et al. | 427/250 |
| 5,203,925 | 4/1993 | Shibuya | 118/726 |
| 5,204,141 | 4/1993 | Roberts et al. | 427/255 |
| 5,204,314 | 4/1993 | Kirlin | 118/726 |

FOREIGN PATENT DOCUMENTS

0435088  3/1991  European Pat. Off. .

OTHER PUBLICATIONS

MAT. RES. SOC. SYMP. PROC. VLSIV. 1990 Materials Research Society, No Month T. Shinzawa et al., pp. 377–382, "Selective Al CVD Using Dimethyl Aluminum".
T. Amazawa, et al., "a 0.25μ Via Plug Process Using Selective CVD Aluminum for Multilevel Interconnection", Int'l Elec. Dev. Meeting 1991, pp. 265–268. No Month.

*Primary Examiner*—Michael Lusignan
*Assistant Examiner*—David M. Maiorana
*Attorney, Agent, or Firm*—Fitzpatrick, Cella, Harper & Scinto

[57] ABSTRACT

A chemical vapor deposition method for forming a deposited film on a substrate using a film-forming liquid raw material. The film-forming liquid is pulverized into liquid fine particles which are heated together with a gas to produce a film-forming raw material gas. The film-forming raw material gas is introduced into a reaction chamber where it chemically reacts with a surface of a substrate which is present in the reaction chamber.

12 Claims, 19 Drawing Sheets

5,547,708

CHEMICAL VAPOR DEPOSITION METHOD FOR FORMING A DEPOSITED FILM WITH THE USE OF LIQUID RAW MATERIAL

This application is a division of application Ser. No. 07/997,543 filed Dec. 28, 1992, now U.S. Pat. No. 5,383,970.

BACKGROUND OF THE INVENTION

1. Field of the Invention

The present invention relates to an improved chemical vapor deposition method which enables one to form various deposited films such as metal films, semiconductor films and insulating films usable in the preparation of semiconductor devices, memories such as photoelectromagnetic diskes, flat panel displays, and the like using a liquid film-forming raw material. The present invention also relates to an apparatus suitable for practicing said chemical vapor deposition method.

2. Related Background Art

There are known a number of deposited films formed by a chemical vapor deposition technique using an appropriate chemical vapor deposition apparatus. These deposited films can be categorized into three groups i.e., metal film group, semiconductor film group and insulating film group.

Any of these deposited films is required to be formed such manner that it satisfies the related conditions in order for it to be practically applicable as a constituent element of the device. Particularly, in the case of forming a semiconductor deposited film by a chemical vapor deposition method (hereinafter referred to as CVD method), it is desired to be formed in such a state that it is free of defects and uniform in thickness.

Similarly, in the case of forming an insulating deposited film by a CVD method, it is desired to be formed in such a state that it is free of defects, uniform in thickness and excels in step coverage. There is a specific requirement relative to the step coverage in the case of forming an insulating deposited film since the insulating deposited film is often used for the purpose of insulating between wirings or protecting an uneven surface of a constituent member of electronic devices such as integrated circuit (IC).

Further, in the case of forming a metal deposited film by a CVD method, it is desired to be formed in a similar state to that of the insulating deposited film, that is, in such a state that it is uniform in thickness and excels in step coverage. The metal deposited film is often used for the purpose of wiring ICs. In this case, the metal deposited film is formed at least to satisfy the condition relative to step coverage because the upper and lower wirings are connected by the metal deposited film formed through apertures which are so-called contact-holes or through-holes.

There are known various chemical vapor deposition apparatus (the chemical vapor deposition apparatus will be hereinafter referred to as CVD apparatus) capable of practicing the above CVD methods.

A typical example of such CVD apparatus is of the constitution schematically shown in FIG. 8. Explanation will be made of the CVD apparatus shown in FIG. 8.

In FIG. 8, numeral reference 403 indicates a reaction vessel comprising a tube made of quartz or the like. The reaction vessel 403 contains a plurality of substrate holders 410 installed therein. Numeral reference 409 indicates a substrate on which a film is to be deposited which is placed on each of the substrate holders 410.

Numeral reference 408 indicates an exhaust pipe which is connected to a main vacuum pump 404 comprising a mechanical booster pump or the like and a sub-vacuum pump 405 comprising a rotary pump or the like. The inside of the reaction vessel 403 can be evacuated through the exhaust pipe 408 by actuating these vacuum pumps.

The reaction vessel 403 is provided with a gas supply system comprising a gas feed pipe 407 extending from a bomb (a bubbling vessel in other words) 402 which is equipped with a bubbling mechanism capable of bubbling a liquid raw material 411 such as an organic aluminum contained in the bomb 402. Numeral reference 406 indicates a gas supply pipe for introducing a bubbling carrier gas from a gas reservoir (not shown) into the bomb 402. The gas supply pipe is provided with a controller 401 capable of controlling the flow rate of the bubbling carrier gas to be introduced into the bomb 402.

The liquid raw material contained in the bomb 402 is bubbled by the action of the bubbling carrier gas introduced therein through the gas supply pipe 406 to produce a gaseous mixture comprising the raw material and the carrier gas, which is followed by supplying into the reaction vessel 403 through the gas feed pipe 407.

The CVD apparatus shown in FIG. 8 is acceptable as long as film formation is conducted on a laboratory scale by a conventional CVD technique. However, the CVD apparatus is not suitable in the case where a deposited film is formed while minute-processing or in the case where a large area deposited film is formed.

Description will be made of this situation of the conventional CVD apparatus shown in FIG. 8.

Incidentally, in recent years, the use of an aluminum film formed not by means of a sputtering method but by means of a CVD method as a wiring material in semiconductor devices of a very large scale integration such as VLSI, ULSI, etc. has been highlighted. Particularly, there have been reported experimental results in that in the CVD method using an organic compound comprising an organic aluminum as a film-forming raw material, the conditions for depositing an aluminum film on an insulating material are distinguishably different from those for depositing said aluminum film on a conductive material, and because of this, said CVD method makes it possible to deposit an aluminum film selectively only on a conductive material or a semiconductor material (see, T. Shinzawa et als., "SELECTIVE Al CVD USING DIMETHYLALUMINUM HYDRIDE", pp. 377–382, Mat. Res. Soc. Symp. Proc. VLSI V, 1990; and T. Amazawa et al., "A 0.25 μm VIA PLUG PROCESS USING SELECTIVE CVD ALUMINUM FOR MULTILEVEL INNTERCONNECTION", pp. 265–266, IEDM 1991).

This CVD method of depositing an aluminum film selectively on an object is considered to be useful in the case of preparing a minute integrated circuit. Especially in the case where the aspect ratio of an aperture (that is, the ratio between the depth and the diameter of the aperture) exceeds 1 upon preparing such minute integrated circuit, the precise wiring using an aluminum film could be attained by the above CVD method, although it cannot be attained as desired by a sputtering method.

In the case where wiring with the use of an aluminum film upon preparing the minute integrated circuit wherein the aspect ratio is beyond 1 is conducted by means of a sputtering technique, it is extremely difficult to accomplish the wiring as desired without causing any disconnection. The reason for this will be described with reference to FIGS. 9(a) and 9(b) respectively showing a stacked configuration obtained by means of a sputtering technique. In FIGS. 9(a) and 9(b), numeral reference 201 indicates a single crystal silicon substrate, numeral reference 202 indicates an insulating layer composed of silicon dioxide or the like, and numeral reference 203 indicates a wiring material such as aluminum or the like. Numeral reference 204 in FIG. 9(a) indicates a recession occurred at the wiring material 203 situated in an aperture of the insulating layer 202, wherein the recession becomes to cause a disconnection of the wiring. Numeral reference 205 in FIG. 9(b) indicates a cavity occurred within the wiring material 203 situated in an aperture of the insulating layer 202, wherein the cavity becomes to cause a disconnection of the wiring.

FIG. 9(a) shows a state of wiring wherein the aspect ratio is relatively small, that is, less than 1. FIG. 9(b) shows a state of wiring wherein the aspect ratio exceeds 1.

In each of the two stacked configurations shown in FIGS. 9(a) and 9(b), all the constituents except the single crystal silicon substrate 201 are formed by means of a sputtering technique.

On the other hand, FIG. 9(c) is of a stacked configuration formed utilizing the selective deposition by the CVD method.

In FIG. 9(c), numeral reference 301 indicates-a single crystal silicon substrate, numeral reference 302 indicates an insulating layer composed of silicon dioxide or the like, numeral reference 303 a metal material formed by means of a CVD technique, numeral reference 304 indicates an aluminium wiring formed by either a sputtering technique or a CVD technique.

Now, it is understood that in each of the two stacked configurations shown in FIGS. 9(a) and 9(b) formed by the sputtering technique, there are unavoidably occurrs the recession 204 or the cavity 205 at or within the aluminum wiring 203. On the other hand, as apparent from what shown in FIG. 9 showing a stacked configuration formed utilizing the selective deposition by the CVD method, it is understood that a disconnection of the wiring hardly occurrs since the aperture of the insulating layer 302 is filled up with the aluminum wiring material 303 formed by the selective deposition by the CVD method.

The aluminum film selective deposition by the CVD method according to the above report can be practiced using the CVD apparatus shown in FIG. 8, for example, in the following manner.

That is, a carrier gas CGS such as $H_2$ gas is supplied into the bomb 402 (the bubbling vessel in other words) containing a liquid organic aluminum 411 therein through the gas supply pipe 406 while controlling the flow rate of the carrier gas by the gas flow controller 401. Specific examples of the organic aluminum are dimethylaluminum hydride (DMAH), triisobutylaluminum (TIBA), etc. which are in the liquid state at normal temperature. When the carrier gas is introduced into such liquid organic aluminum 411 contained in the bomb 402, the liquid organic aluminum is bubbled by the action of the carrier gas to produce a gaseous mixture comprising the organic aluminum and the carrier gas, which is followed by flowing into the reaction vessel 403 through the gas feed pipe 407. The gaseous mixture into the reaction vessel 403 is decomposed by the action of heat radiated from each of the substrates 409 maintained at elevated temperature to cause chemical reaction with the surface of each of the substrates, whereby an aluminum film is deposited on each of the substrates 409.

In this case, the gaseous mixture unreacted in the reaction vessel 403 is exhausted through the exhaust pipe 408 by operating the main vacuum pump 404 and the sub-vacuum pump 405.

The above aluminum film selective deposition by the CVD method using the CVD apparatus shown in FIG. 8 seems effective as long as the aluminum film selective deposition is conducted on a laboratory scale by a conventional CVD technique. However, the foregoing effects of causing selective deposition of an aluminum film on a given object according to the above report cannot be attained as desired in the case where the CVD apparatus is structurally modified or it is enlarged to an industrial scale, wherein problems entail in that the aluminum film selective deposition does not proceeds as desired, defects are increased not only in a metal film but also in a semiconductor film, and a desirable step coverage is hardly attained in an insulating film. The reasons for this are considered due to the factors that (i) the mixing ratio between a liquid compound as the raw material and a gas as the carrier gas is hardly controlled as desired, (ii) the mixing ratio of the liquid compound is varied depending upon a change in the temperature in the vicinity of the bubbling vessel, and (iii) the mixing ratio of the liquid compound is varied depending upon the amount of the unvaporized residue in the bubbling vessel.

SUMMARY OF THE INVENTION

The present invention is aimed at eliminating the foregoing problems in the known apparatus for practicing the CVD method of conducting the selective deposition of an aluminum film on an object and providing an improvement in the known CVD method and the known CVD method while making use of the advantages of them.

Another object of the present invention is to provide an improved CVD method and an improved CVD apparatus which excel in operation efficiency and productivity and which enable one to produce various semiconductor devices at a reduced production cost.

A further object of the present invention is to provide an improved CVD method and an improved CVD apparatus which enables one to stably form a high quality deposited film on a given object without depending upon changes not only in the atmospheric conditions but also in the operation parameters.

A further object of the present invention is to provide an improved CVD method and an improved CVD apparatus capable of stably conducting the selective deposition of a high quality deposited film on an object without depending upon changes not only in the atmospheric conditions but also in the operation parameters.

A further object of the present invention is to provide an improved CVD apparatus and an improved CVD method which enable one to uniformly form a large area, high quality deposited film with few defect on an object with the use of a liquid film-forming raw material.

A further object of the present invention is to provide an improved CVD apparatus and an improved CVD method which enable one to uniformly form a large area, high quality deposited film with few defect on an object in a state that excels in step coverage, with the use of a liquid film-forming raw material.

The CVD method according to the present invention, which attains the above objects, comprises supplying a film-forming liquid raw material such as an organic metal material in liquid state at normal temperature into a specific gasifying system as it is while controlling the amount thereof to be supplied by weighing it, simultaneously supplying a carrier gas into said gasifying system, wherein the film-forming liquid raw material is pulverized into liquid fine particles capable of being easily gasified and the liquid fine particles are heated together with the carrier gas to thereby produce a gaseous material composed of the organic metal material and the carrier gas; and introducing said gaseous material into a reaction chamber, wherein the gaseous material causes chemical reaction with a surface of a substrate disposed in said reaction chamber while being maintained at elevated temperature by the aid of heat radiated from the substrate, to thereby cause the formation of a desirable deposited film composed of the metal material on the substrate.

The CVD apparatus according to the present invention, which attains the above objects, is suitable for practicing the above CVD method and it comprises a reaction chamber provided with means for evacuating the inside of said reaction chamber, means for holding one or more substrates, on which a film is to be deposited, in said reaction chamber and a gas feed means for introducing a film-forming raw material gas into said reaction chamber, said gas feed means being provided with means for gasifying a liquid raw material and means for introducing a gaseous material into said reaction chamber, characterized in that said gas feed means comprises a control means capable of controlling the amount of said liquid raw material to be introduced and a gasifying means of a specific structure capable of gasifying said liquid raw material with the aid of a carrier gas and introducing a gaseous material into said reaction chamber, said gasifying means being positioned in the downstream side of said control means.

The present invention has been accomplished based on the following findings which were obtained by the present inventors through experiments.

That is, in the case where the selective deposition of an aluminum film by the CVD method using DMAH as the film-forming raw material and $H_2$ gas the carrier gas, the following two chemical reactions proceed on the surface of a semiconductor having an insulating film thereon.

$$2\ Al(CH_3)_2H + H_2 \rightarrow 2\ Al + 4\ CH_4 \tag{1}$$

$$2\ Al(CH_3)_2H \rightarrow 2\ Al + 2\ CH_4 + C_2H_6 \tag{2}$$

In this case, if a chemical reaction proceeds as shown in the reaction formula (1), the deposition selectivity is ensured between the surface of the semiconductor and the surface of the insulating film. However, if a simple thermal decomposition reaction proceeds as shown in the reaction formula (2), the deposition selectivity between the semiconductor and the insulating film is sometimes hardly attained. This is due to the fact that the molar ratio between the DMAH and the $H_2$ gas in the gaseous material imparts a negative influence to the chemical reaction of the gaseous material upon depositing the aluminum film.

In order to prevent this problem from occurring, it is preferred to introduce an excessive amount of the $H_2$ gas. However in the case where the $H_2$ gas is introduced in an amount beyond a prescribed amount, the film-forming chemical reaction in the reaction chamber becomes to be in a rate-limiting state, resulting in entailing problems such that the deposition rate varies depending upon the size of an aperture of a member on which a deposited film is to be formed and that the form of an aluminum embedded in the aperture is liable to have such a facet face as shown in FIG. 10 (with 501 being a single crystal silicon substrate, 502 being an insulating layer disposed on the single crystal silicon substrate and 505 being an aluminum having a facet face, embedded in the aperture of the insulating layer), wherein it is extremely difficult to deposit an aluminum in the aperture so that the aperture is filled up with the aluminum in a state to provide a flat surface at the top of the aluminum embedded. In this respect, it is difficult to attain a desirable CVD method capable of depositing an aluminum selectively at a predetermined position on a industrial scale unless the system is designed such that the mixing ratio between the DMAH and the $H_2$ in the reaction chamber can be properly controlled to an optimum value.

In the following, the results of studies by the present inventors on the optimum condition with respect to the mixing ratio between the DMAH and the $H_2$ upon conducting the selective deposition of an aluminum by the CVD method will be described.

The mixing ratio in terms of molar ratio between the DMAH and the $H_2$ gas is decided depending on the ratio between a saturated vapor pressure of the DMAH and a partial pressure of the $H_2$ respectively at the outlet of the bubbling vessel. This situation can be expressed by the following equation (I).

where $N_{DMAH}$ is a molar concentration of the DMAH to be introduced into the reaction chamber; $N_{H_2}$ is a molar concentration of the $H_2$ gas to be introduced into the reaction chamber; $P_{DMAH}$ is a partial pressure (a saturated vapor pressure) of the DMAH at the outlet of the bubbling vessel; and $P_{H_2}$ is a partial pressure of the $H_2$ at the outlet of the bubbling vessel.

$P_{DMAH}$ is unconditionally decided depending on the temperature of the DMAH itself in liquid state, and it is in the range of from 1 to 2 Torr at normal temperature. $P_{H_2}$ can be controlled by the gas flow controller (the pressure regulating valve in other words), but the control precision thereof is substantially governed by the precision of the pressure regulating valve. In the case where the ration between $P_{DMAH}$ and $P_{H_2}$ is intended to control to several times, $P_{H_2}$ is necessary to be controlled to a value of 10 Torr or below, wherein the regulating valve is required to one that has a precision capable of controlling the gaseous pressure to several Torr as desired. However, such regulating is not available at the present time.

Now, as apparent from the equation (I), it is understood that the mixing ratio in termes of molar ratio between the DMAH and the $H_2$ gas is varied depending on $P_{DMAH}$. However, in practice, it is varied depending on the temperature of the DMAH since $P_{DMAH}$ is simply of the saturated vapor pressure of the DMAH.

Shown in FIG. 11 is a graph showing the temperature dependency of the saturated vapor pressure of the DMAH.

As apparent from FIG. 11, $P_{DMAH}$ is exponentially varied depending on the temperature of the DMAH.

On the other hand, as for $P_{H_2}$, it is not changed exponentially as in the case of $P_{DMAH}$ since the $H_2$ gas is in gaseous state at normal temperature.

In view of the above, it is understood that the mixing ratio between the DMAH and the $H_2$ gas in termes of molar ratio is greatly varied depending on a change in the inside temperature of the bubbling vessel.

The partial pressure of the $H_2$ gas (that is, $P_{H_2}$) at the outlet of the bubbling vessel is not equivalent to that at the inlet of the bubbling vessel. This situation can be expressed by the following equation (II).

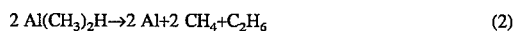

where $P_{H_2}$ (out) is a partial pressure of the $H_2$ gas at the outlet of the bubbling vessel; $P_{H_2}$ is a partial pressure of the H₂ gas at the inlet of the bubbling vessel; ρ is a specific gravity of the organic metal (that is, Al); and h is a distance between the outlet of the carrier gas supply pipe in the bubbling vessel and the surface of the liquid (that is, the DMAH contained in the bubbling vessel).

As apparent from the equation (II), the variable capable of being controlled by the regulating valve of the carrier gas supply pipe is only $P_{H_2}$ (in). However, the value of the "h" becomes small as the film formation proceeds and this results in changing $P_{H_2}$ (out). $P_{H_2}$ (in) is required to be adjusted by the residual liquid in the bubbling vessel in order to constantly maintain $P_{H_2}$ (out) at a predetermined level. However, it is almost impossible to accomplish this as desired.

As apparent from what above described, the known CVD technique including the CVD method and the CVD apparatus are accompanied by problems, which are hardly solved, such that it is extremely difficult to continuously control the mixing ratio between a film-forming liquid material and a carrier gas and it is extremely difficult to establish optimum film-forming conditions upon selectively depositing a desired material on an object.

The present invention is free of these problems in the known CVD technique since in the present invention, such bubbling step as in the known CVD technique is not employed upon gasifying the film-forming liquid raw material. Particularly, in the present invention, a film-forming liquid raw material such as an organic metal material in liquid state at normal temperature is supplied into a specific gasifying system as it is while controlling the amount thereof to be supplied by weighing it, wherein the film-forming liquid raw material is pulverized into liquid fine particles capable of being easily gasified and the liquid fine particles are heated together with a carrier gas separately supplied to thereby produce a gaseous material composed of the organic metal material and the carrier gas, and the gaseous material thus produced is followed by introducing into a reaction chamber, wherein the gaseous material causes chemical reaction with a surface of a substrate being maintained at elevated temperature by the aid of heat radiated from the substrate, to thereby cause the formation of a desirable deposited film composed of the metal material on the substrate.

In the present invention, the mixing ratio in terms of molar ratio between the film-forming raw material and the carrier gas can be easily and appropriately controlled with a high precision without having a due regard on the saturated vapor pressure of the liquid film-forming raw material as in the case of the known CVD technique.

In the present invention, it is possible to use a proper reactive gas capable of contributing to the formation of a deposited film together with the liquid organic metal material. In this case, the above advantages of the present invention are attained.

Thus, according to the present invention, a desirable CVD method capable of depositing a desired material selectively on a given object is attained.

The present invention makes it possible to efficiently form a large area metal film using a liquid organic metal material. According to the present invention, it is also possible to efficiently form a high quality semiconductor film excelling in uniformity using a proper liquid film-forming material while controlling the composition ratio among the elements constituting the semiconductor film formed. In addition, it is possible to efficiently form a high quality semiconductor film having a desired band gap.

Pronounced effects are provided in the case of forming an insulating film comprising silicon oxide ($Si_xO_y$) or silicon nitride ($Si_xN_y$), in that x and y of the $Si_xO_y$ or $Si_xN_y$ can be easily controlled as desired and a result, the resulting insulating film becomes to be uniform in dielectric constant.

Further in addition, the present invention makes it possible to supply a large amount of a film-forming raw material into the system upon film formation and because of this, a high quality deposited film excelling in uniformity can be efficiently formed not only on a large area substrate but also on each of a plurality of substrates at an improved deposition rate.

DETAILED DESCRIPTION OF THE INVENTION

Figure 1:
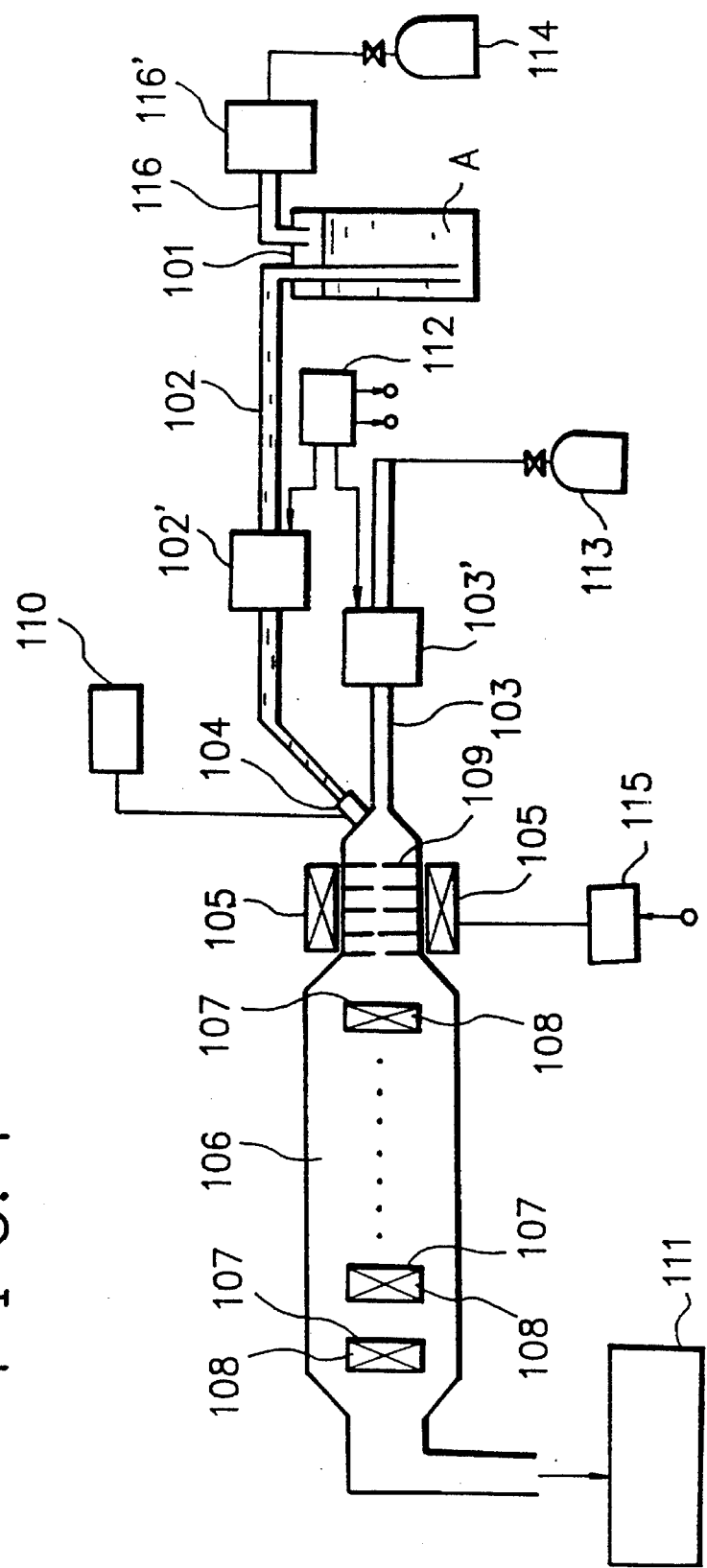
FIG. 1 is a schematic diagram illustrating the constitution of a first embodiment of a CVD apparatus according to the present invention.

The present invention includes an improved CVD method capable of efficiently forming a high quality deposited film on a substrate using a film-forming liquid raw material and an improved CVD apparatus capable of practicing said CVD method.

As above described, the CVD method according to the present invention comprises supplying a film-forming liquid raw material such as an organic metal material in liquid state at normal temperature into a specific gasifying system as it is while controlling the amount thereof to be supplied by weighing it, simultaneously supplying a carrier gas into said gasifying system, wherein the film-forming liquid raw material is pulverized into liquid fine particles capable of being easily gasified substantially and the liquid fine particles are heated together with the carrier gas to thereby produce a gaseous material composed of the organic metal material and the carrier gas; and introducing said gaseous material into a reaction chamber, wherein the gaseous material causes chemical reaction with a surface of a substrate disposed in said reaction chamber while being maintained at elevated temperature by the aid of heat radiated from the substrate, to thereby cause the formation of a desirable deposited film composed of the metal material on the substrate.

The CVD apparatus according to the present invention which is suitable for practicing the above CVD method comprises a reaction chamber provided with means for evacuating the inside of said reaction chamber, means for holding one or more substrates, on which a film is to be deposited, in said reaction chamber and a gas feed means for introducing a film-forming raw material gas into said reaction chamber, said gas feed means being provided with means for gasifying a liquid raw material and means for introducing a gaseous material into said reaction chamber, characterized in that said gas feed means comprises a control means capable of controlling the amount of said liquid raw material to be introduced and a gasifying means of a specific structure capable of gasifying said liquid raw material with the aid of a carrier gas and introducing a gaseous material into said reaction chamber, said gasifying means being positioned in the downstream side of said control means.

According to the present invention, there are provided marked advantages such that 100% of the film-forming liquid raw material is substantially gasified, the mixing ratio in terms of molar ratio between the film-forming raw material and the carrier gas is appropriately controlled with a high precision, and as a result, a high quality deposit film is efficiently formed on an object including a substrate and other members at an improved deposition rate.

The present invention provides other advantages as will be described below.

That is, according to the present invention, it is possible to use a proper reactive gas capable of contributing to the formation of a deposited film together with the liquid organic metal material.

According to the present invention, it is also possible to efficiently form a high quality semiconductor film excelling in uniformity using a proper liquid film-forming material while controlling the composition ratio among the elements constituting the semiconductor film formed. In addition, it is possible to efficiently form a high quality semiconductor film having a desired band gap.

Further, the present invention makes it possible to supply a large amount of a film-forming raw material into the system upon film formation. Because of this, a high quality deposited film excelling in uniformity can be efficiently formed not only on a large area substrate but also on each of a plurality of substrates at an improved deposition rate.

As the film-forming liquid raw material used in the present invention, commercially available liquid raw materials usable for the formation of a film may be selectively used depending upon the related conditions for the formation of a deposited film. In general, liquid raw materials which are in liquid state at normal temperature are desirably used.

Specific examples of such liquid raw material are trimethylaluminum (TMA), triethylaluminum (TEA), triisobutylaluminum (TiBA), dimethylaluminum hydride (DMAH), diethylaluminum hydride (DEAH), monomethylaluminum hydride (MMAH), trimethylindium (TMIn), triethylindium (TEIn), trimethylgallium (TMGa), triethylgallium (TEGa), dimethylzinc (DMZn), trichlorosilane ($SiHCl_3$), silicon tetrachloride ($SiCl_4$), tetraethlyorthosilicate (TEOS), fluorotriethoxysilane (FOTES), tetramethyltin ($Sn(CH_3)_4$), $POCl_3$, $BBr_3$, etc. These compounds may be used either singly or in combination of two or more of them in the present invention.

Of these compounds, organic metal compounds are desirably used in the present invention. Incidentally, these organic metal compounds could not be effectively used in the conventional metal film-forming CVD technique because they are hardly vaporized at normal temperature and under normal pressure and are difficult to be transported.

However, in the present invention, any of these organic metal compounds can be effectively used wherein the object of the present invention is attained as desired.

As the carrier gas used in the present invention, there can be illustrated inert gases such as Ar gas, He gas, etc., $H_2$ gas, $O_3$ gas, $NH_3$ gas, NO gas, $N_2$ gas, etc. These gases are selectively used depending upon the situation. Of these gases, $O_3$ gas, $NH_3$ gas, NO gas and $N_2$ gas may be used also as the reactive gas.

In the case of forming a compound semiconductor film or a semiconductor film of a desired conduction type according to the present invention, a relevant gas capable of imparting a given dopant is introduced into the gasifying system together with the carrier gas. Specific example such gas are PH₃ gas, AsH₃ gas, BF₃ gas, B₂H₆ gas, SiH₄ gas, Si₂H₆ gas, etc.

The deposited film to be formed according to the present invention includes metal films of metals such as Al, In, Ga, Zn, Sn, etc.; compound semiconductor films of GaAs, GaAlAs, InP, ZnSe, ZnSeTe, etc.; other semiconductor films of Si, SiGe, etc.; oxide films of $SiO_2$, SION, SnO, InSnO, ZnO, ZnAlO, etc.; and nitride films of InN, AlN, SiN, BN, etc.

In the present invention, in the case of forming a compound semiconductor film comprising a plurality of elements, for example, a GaAlAs film using a plurality of liquid raw materials, for example, TMGa and TMA wherein $AsH_3$ gas is used as the source of introducing As, the CVD apparatus used is desired to be provided with a plurality of gas feed means (two gas feed means in the case of forming the GaAlAs film) respectively having the foregoing consitution comprising the control means capable of controlling the amount of the liquid raw material to be introduced and the gasifying means capable of gasifying the liquid raw material with the aid of the carrier gas and introducing a gaseous material produced into the reaction chamber, in which each of the gas feed means serves to gasify one of the liquid raw materials. In this case, the composition ratio of each of the plurality of elements constituting the semiconductor film formed can be precisely controlled.

Description will be made of the gasifying means employed in the present invention.

The gasifying means is provided with a gasifying vessel having a specific constitution (which will be later detailed) capable of gasifying the liquid raw material with the aid of the carrier gas. The liquid raw material introduced into the gasifying vessel is desired to be substantially gasified by 100% therein. Therefore, in a preferred embodiment, the liquid raw material is pulverized into liquid fine particles in a state capable of being easily gasified prior to introducing the liquid raw into the gasifying vessel, which are followed by introducing into the gasifying vessel wherein the liquid fine particles are gasified with the aide of the carrier gas.

The gasifying means is desired to be designed such that the inner pressure of the gasifying vessel can be reduced step-wise or continuously in the direction of gas to flow and that the inside of the gasifying vessel can be maintained at a temperature which is lower than the temperature of the substrate placed in the reaction chamber but is higher than the inside temperature of the supply system of supplying the liquid raw material into the gasifying means.

The gasifying means is desired to be provided with a liquid Jetting means or a variable venturi mechanism respectively capable of pressure-spraying the liquid raw material through one or more minute nozzles or orifices to provide liquid fine particles.

The variable venturi mechanism herein means one that is provided with means capable of weighing and controlling the amount of the liquid raw material to be supplied.

In a preferred embodiment of the gasifying vessel, it is provided with a pressure alternating means comprising one or more plate-like members respectively provided with a plurality of perforations in order to establish a pressure difference or a pressure gradient in the gasifying vessel.

The pressure alternating means is disposed in the gas pathway of the gasifying vessel so that gas is allowed to flow through those perforations toward the reaction chamber.

In the case where the pressure alternating means comprises a plurality of the plate-like members, the perforations of each of the plate-like members are desired to be designed such that their size is gradually diminished as to each of the plate-like members spacedly arranged from the upstream side toward the downstream side. In this case, a desirable pressure gradient is established in the gasifying vessel.

In order to maintain the temperature of the gas in the gasifying vessel, the gasifying vessel is desired to be provided with a heating means. Specific examples of the heating means are heat generating resistors, infrared lamps, etc. In any case, the heating means may be disposed either inside or outside the gasifying vessel. The heating means is desired to be provided with a temperature sensor. In the case where the heat generating resistor as the heating means is disposed inside the gasifying vessel, the gas in the gasifying vessel can be uniformly maintained at a desired temperature.

The conditions relative to the gas pressure and the temperature of the gas in the gasifying vessel are different depending upon the kind of the liquid raw material used, the scale of the apparatus, or the like.

The gasifying vessel is desired to be designed by properly combining the liquid Jetting means, the pressure alternating means and the heating means while having a due care about the above conditions.

In order to optimize the transportation efficiency of the gas so that a desirable deposition rate is attained for a film formed on the substrate in the reaction chamber, the heating means is desired to be disposed at an appropriate position in the gasifying vessel. In a preferred embodiment, the heat generating resistor is disposed at the plate-like member as the pressure alternating means together with the temperature sensor such that the plate-like member has a desirably uniform in-plane distribution of temperature therein. In this case, the heat generating resistor is desired to be disposed in the vicinity of the perforations of the plate-like member in order to prevent the temperature from changing due to a pressure difference caused in the vicinity of the perforations.

In the case where a plurality of the plate-like members respectively as the pressure alternating means are used in combination with the liquid jetting means, the inside temperature of the gasifying vessel is liable to vary relatively extensively at the position where the liquid raw material is gasified and mixed with other gas such as the carrier gas. Therefore due care should be taken so that this problem is prevented from occurring. In a preferred embodiment, the heat generating resistor is disposed at least at the plate-like member which is situated in the most upstream side and at the position close to the Jetting outlet of the liquid jetting means. It is a matter of course that the temperature sensor is disposed together with the heat generating resistor in this case.

In the present invention, it is an important factor to gasify the entire of the liquid raw material introduced into the gasifying vessel without decomposing the liquid raw material in the gasifying vessel. For this purpose, the temperature of each of the related positions of the system should be properly controlled based on relative and organic relationships of those positions. Particularly, at least the surface temperature (Tsub) of the substrate upon forming a deposited film thereon, the inside temperature (Tspy) of the gas supply system upon supplying the liquid raw material into the gasifying vessel and the temperature (Teva) of the plate-like member in the gasifying vessel upon gasifying the liquid material are desired to determine so as to satisfy the equation: Tsub>Teva>Tspy.

The CVD apparatus according to the present invention will be described more specifically with reference to the drawings as follows. The description is not intended to limit the scope of the present invention.

Apparatus Embodiment 1

FIG. 1 is a schematic diagram of a first embodiment of the CVD apparatus according to the present invention.

In FIG. 1, numeral reference 101 indicates a container containing a liquid raw material A therein. Numeral reference 116 indicates a gas supply conduit for supplying a forced gas comprising an inert gas such as Ar gas, He gas, etc. or other gas such as $N_2$ gas into the container 101. The gas supply conduit 116 is extending from a reservoir 114 for such gas through a gas pressure controller 116'. Numeral reference 102 indicates a liquid transportation conduit for transporting the liquid raw material A from the container 101 into a reaction vessel 106. The reaction chamber 106 comprises a liquid gasifying zone situated in the upstream portion, a film deposition zone situated in the central portion and an gas exhausting zone situated in the downstream portion.

Numeral reference 102' indicates a liquid flow controlling equipment capable of detecting and precisely controlling the flow rate of the liquid raw material A which is provided at the liquid transportation conduit 102.

The liquid transportation conduit 102 is connected to the upstream side of the reaction chamber 106 through a liquid supply head 104 provided with a piezoelectric transducer (not shown in FIG. 1). The liquid supply head 104 is of the constitution shown in FIG. 3 (which will be later detailed). Numeral reference 110 indicates a driving circuit which is electrically connected to the liquid supply head 104.

Numeral reference 113 indicates a reservoir containing the foregoing carrier gas. Numeral reference 103 indicates a gas transportation conduit extending from the reservoir 113. The gas transportation conduit 103 is connected to the upstream side of the reaction chamber 106. The gas transportation conduit 103 is provided with a mass flow controller 103'.

Numeral reference 109 indicates a heating member comprising one or more quartz plates 109 provided with a plurality of perforations which is disposed in the liquid gasifying zone of the reaction chamber 106. This situation will be later explained more specifically with reference to FIG. 2.

Numeral reference 105 indicates an electric heating device which is disposed so as to surround the exterior of the liquid gasifying zone of the reaction chamber 106 in which the quartz plate(s) 109 is disposed. Numeral reference 115 indicates a heat controller equipped with a power source (not shown). The heat controller 115 is electrically connected to the electric heating device 105. The heat controller 115 serves to apply a power in order to actuate the electric heating device 105 while adjusting the quantity of the power applied so that the inside of the gasifying zone of the reaction chamber 106 is maintained at a desired temperature.

Numeral reference 111 indicates a vacuum pump which is connected through an exhaust pipe to the downstream side of the reaction chamber 106.

In the film deposition zone of the reaction chamber 106, a plurality of substrate holders 107 are spacedly arranged. Numeral reference 108 indicates a substrate placed on each of the substrate holders 108. Each of the substrate holders 108 has a resistance heating means (not shown) installed therein.

Figure 2:
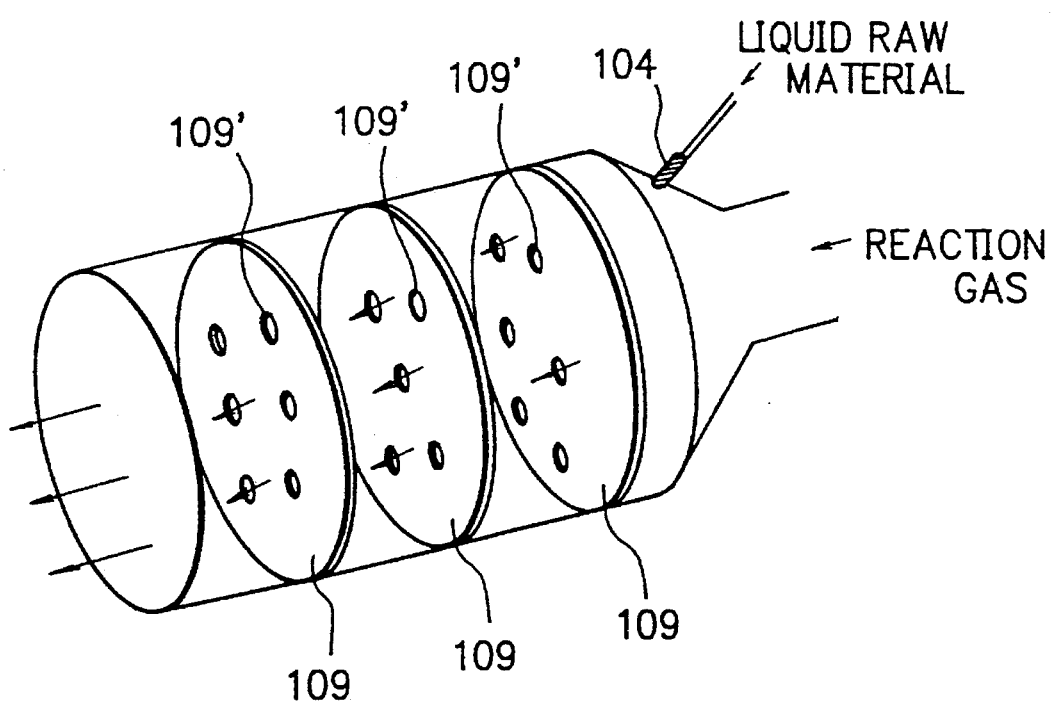
FIG. 2 is a schematic view illustrating the structure of a gasifying vessel used in the CVD apparatus shown in FIG. 1.

Now, explanation will be made of what shown in FIG. 2. FIG. 2 is a schematically enlarged view of the liquid gasifying zone of the reaction chamber 106. In FIG. 2, there are shown three quartz plates 109 which are spacedly arranged in the liquid gasifying zone of the reaction chamber 106. It should be understood that this is only for illustrative purposes. The number of the quartz plate 109 is not limited to three, but may be changed as desired. As apparent from FIG. 2, each of the quartz plates 109 is provided with a plurality of perforations 109' capable of allowing gaseous material to pass through them toward the film deposition zone of the reaction chamber 106.

At least one of the quartz plates 109 may be provided with a temperature sensor (not shown) in order to detect the in-plane temperature distribution of the quartz plate. In this case, the heat controller 115 is also electrically connected to the temperature sensor.

Figure 3:
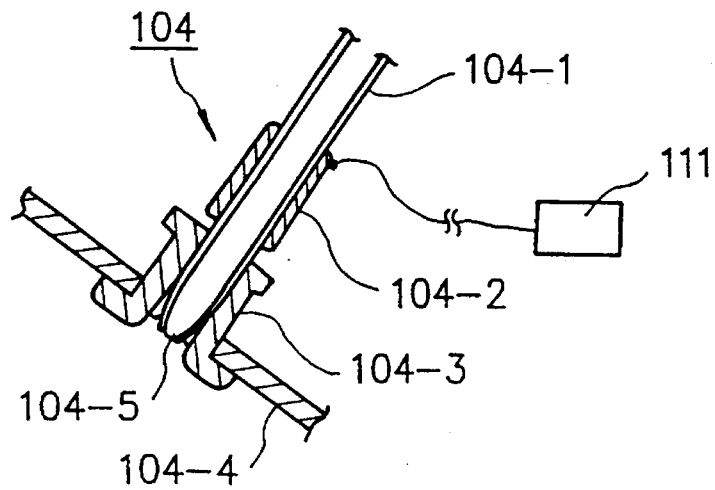
FIG. 3 is a schematic view illustrating the structure of a jetting head used in the CVD apparatus shown in FIG. 1.

Next, explanation will be made of the constitution of the liquid supply pipe 104 with reference to FIG. 3. FIG. 3 is a schematic cross-section view illustrating the constitution of the liquid supply head 104. The liquid supply head 104 comprises a conduit 104-1 made of glass which is provided with a Jetting means 104-5 comprising a nozzle or orifice at the end portion thereof. The conduit 104-1 is provided with a connecting member 104-3 which serves to hermetically communicate the conduit 104-1 with the inside of the reaction chamber 106 through a circumferential wall 104-4 of the reaction chamber.

The conduit 104-1 is designed such that it receives the forced liquid raw material A supplied from the liquid transportation conduit 102 (see, FIG. 1) at a high pressure and transports it into the liquid gasifying zone of the reaction chamber 106 (see, FIG. 1), wherein the forced liquid raw material A is jetted through the jetting means 104-5 by virtue of vibration caused by a piezoelectric transducer 104-2 to provide liquid fine particles which are followed by flowing into the liquid gasifying zone of the reaction chamber 106.

The piezoelectric transducer 104-2 is disposed so as to surround the exterior of the conduit 104-1. The piezoelectric transducer 104-2 is electrically connected to the driving circuit 111. The driving circuit 111 serves to supply a pulse signal voltage to the piezoelectric transducer 104-2 thereby vibrating the piezoelectric transducer.

The liquid fine particles of the liquid raw material jetted from the liquid jetting means 104-5 are successively flown into the liquid gasifying zone of the reaction chamber 106, wherein they are mixed with the carrier gas supplied through the gas transportation conduit 103 to produce a gaseous mixture composed the liquid fine particles and the carrier gas, which is followed by flowing into the film deposition zone of the reaction chamber 106 while passing through the perforations of each of the quartz plates disposed in the liquid gasifying zone, during which the gaseous mixture collides with each of the quartz plates while being heated by the electric heating device 105 whereby the liquid fine particles of the gaseous mixture is gasified to produce a gaseous material. The gaseous material is successively flown into the film deposition zone of the reaction chamber. The gaseous material thus introduced into the film deposition zone is chemically reacted with the surface of each of the substrates maintained at a desired temperature to cause the formation of a deposited film on each of the substrates.

Numeral reference 112 indicates a central control circuit equipped with an operation panel, a memory and a microcomputer which is electrically connected to not only the liquid flow controlling equipment 102' but also the mass flow controller 103'. The central control circuit 112 is also electrically connected to the driving circuit 110. Further, the central control circuit 112 is electrically connected to the heat controller 115. By operating the central control circuit 112, the flow rate of the liquid raw material A supplied through the liquid transportation conduit 102, the flow rate of the carrier gas supplied through the gas transportation conduit 103 and the inside temperature of the gasifying zone of the reaction chamber 106 can be optimized so that desirable liquid fine particles of the liquid raw material are provided and they are desirably gasified in the gasifying zone, resulting in causing the formation of a high quality deposited film on each of the substrates 107 in the film deposition zone of the reaction chamber 106.

The inside temperature of the gasifying zone upon gasifying the liquid raw material is properly determined depending upon the kind of the liquid raw material to be used.

The position of each of the quartz plates 109 to be disposed and the distance between the outlet of the liquid supply head 104 and the quartz plate 109 situated in the most upstream side are appropriately determined by depending upon the constitution of the apparatus.

In this apparatus embodiment, the quartz plates 109 may be replaced by insulating ceramic plates.

Further, in this apparatus embodiment, a micropump can be employed in order to forcedly transport the liquid raw material instead of using the forced gas.

The CVD apparatus is applicable in the case of forming a deposited film on a web-like substrate.

Apparatus Embodiment 2

Figure 4:
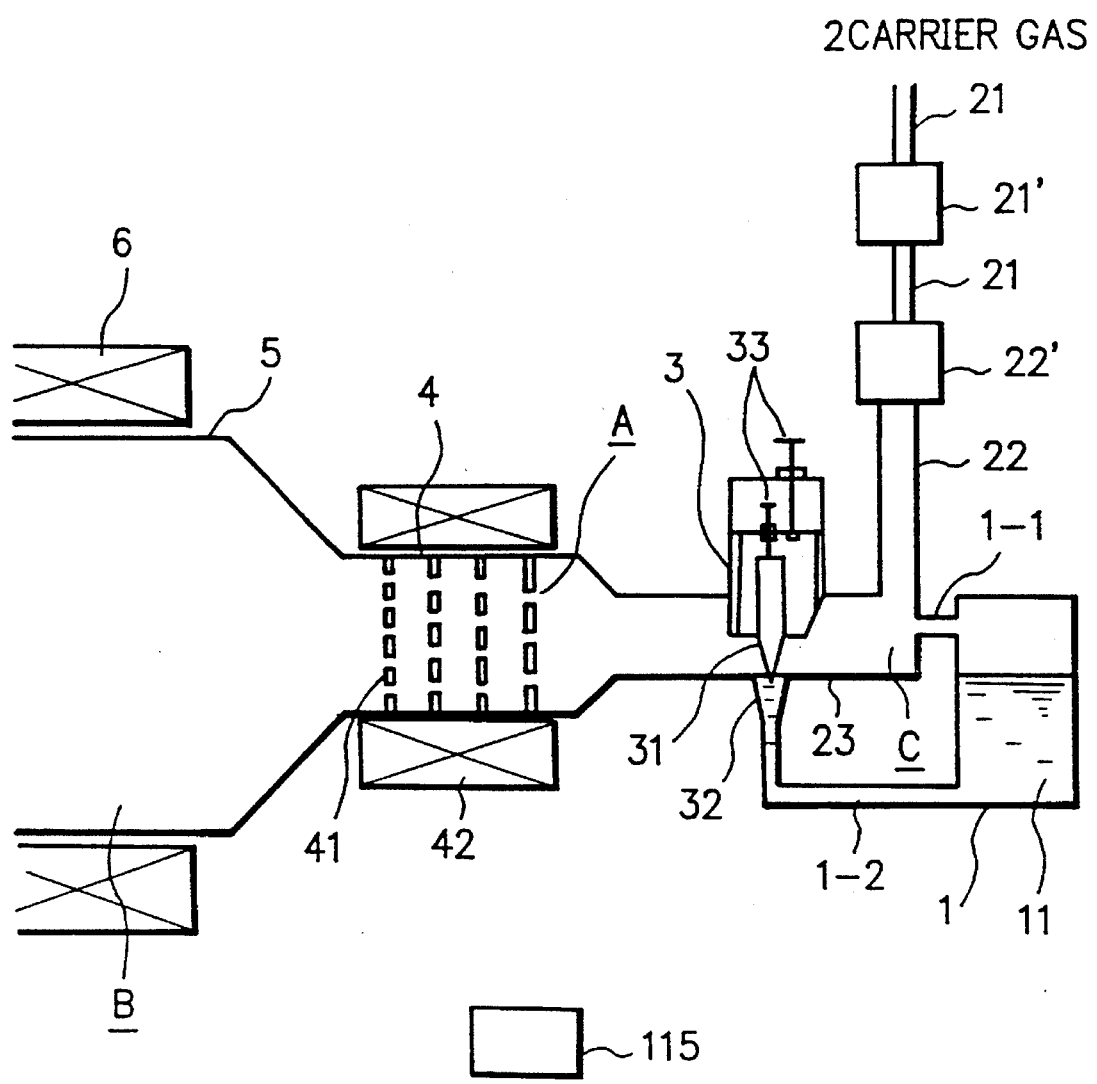
FIG. 4 is a schematic diagram illustrating the constitution of a second embodiment of a CVD apparatus according to the present invention.

This apparatus embodiment is to provide a CVD apparatus of the constitution schematically shown in FIG. 4.

The CVD apparatus shown in FIG. 4 comprises a system for supplying a carrier gas and a film-forming liquid raw material, a system for producing liquid fine particles of the liquid raw material, a system for gasifying the liquid fine particles and a film deposition system comprising a reaction chamber.

Now, referring to FIG. 4, numeral reference 2 indicates a carrier gas such as Ar gas, He gas, etc. from a gas reservoir (not shown). Numeral reference 21 indicates a gas feed pipe provided with a mass flow controller 21'. The gas feed pipe 21 is connected to a gas transportation conduit 22 through a regulating valve 22'. Numeral reference 23 indicates a relatively widened conduit (hereinafter referred to as wide conduit) having a space C, which is extending from the gas transportation conduit 22. Numeral reference 1 indicates a container containing a liquid raw material 11 supplied from a liquid raw material supply source (not shown). The container 1 is provided with a connection pipe 1-3 1 at the upper portion thereof. The container 1 is connected to the wide conduit 23 through the connection pipe 1-1. Numeral reference 1-2 indicates a liquid transportation conduit provided at the bottom portion of the container 1. The liquid transportation conduit 1-2 is opened into the space C of the wide conduit 23 through a throat 32 provided at the top of the liquid transportation conduit. Numeral reference 3 indicates a variable venturi comprising a throttle valve 31 and a mechanical throttle governing mechanism 33 capable of moving the throttle up and down. The venturi 3 is hermetically arranged at the wide conduit 23 such that the throttle valve 31 can be inserted into the throat 32 of the liquid transportation conduit 1-2 by operating the throttle governing mechanism 33. The venturi 3 serves to control the amount of the liquid raw material 11 to be supplied into the space C.

In the above constitution, the liquid raw material 11 is supplied into the container 1 to fill up the throat 32 and the carrier gas 2 is fed through the gas feed pipe 21 and the gas transportation conduit 22 into the space C of the wide conduit 13 while operating the mass flow controller 21' and the regulating valve 22'. In this case, when the carrier gas 2 flows into the space C, a pressure difference P is provided between the space C and the throat 32 owing to the venturi effect, and not only because of the pressure difference P but also by the aid of the pressure of the carrier gas, the liquid raw material 11 in the throat 32 which is situated in the downstream side of the space C is jetted from the throat 32 wherein the liquid raw material are pulverized to cause liquid fine particles while mixing with the carrier gas whereby producing a gaseous mixture comprising the liquid fine particles and the carrier gas. The gaseous mixture is followed by flowing into a liquid gasifying zone 4.

In the following, description will be made of the above situation. When the specific gravity of the carrier gas is denoted by $\rho_C$, the specific gravity of the liquid raw material is denoted by $\rho_S$, the area of the carrier gas pathway which is remained when the top of the throttle valve 31 is dipped into the liquid raw material in the throat 32 is denoted by Ac, the area of the throat 32 which is remained when the top of the throttle valve 31 is dipped into the liquid raw material in the throat 32 is denoted by As, and the difference between the top of the throttle valve 32 and the liquid level of the liquid raw material in the throat 32 when the throttle valve is dipped into the liquid raw material is denoted by h, the mixing ratio R between the flow rate Gc of the carrier gas and the flow rate Gs of the liquid raw material can be expressed by the following equation (1) based on the Bernoulli's theorem:

$$R = G_C/G_S = \frac{C_c A_c}{C_s A_s} \sqrt{\frac{\rho_C - \Delta p}{P_S \cdot \Delta P - \rho_S^2 h}} \quad (1)$$

In the equation (1), Cc is a so-called flow rate factor of the liquid raw material and Cs is a so-called flow rate factor of the carrier gas. Each of these factors is a constant based on the Reynolds number and the pathway form for the liquid raw material or the carrier gas.

From the equation (1), it is understood that when the difference h is≡0, the mixing ratio R is proportional to the ratio of the cross section of the carrier gas pathway, i.e. Ac/As. This means that the mixing ratio R can be properly controlled only by adjusting the throttle governing mechanism 33. As for the flow rate of the carrier gas, it can be properly controlled by operating the mass flow controller 21' as above described.

Figure 5:
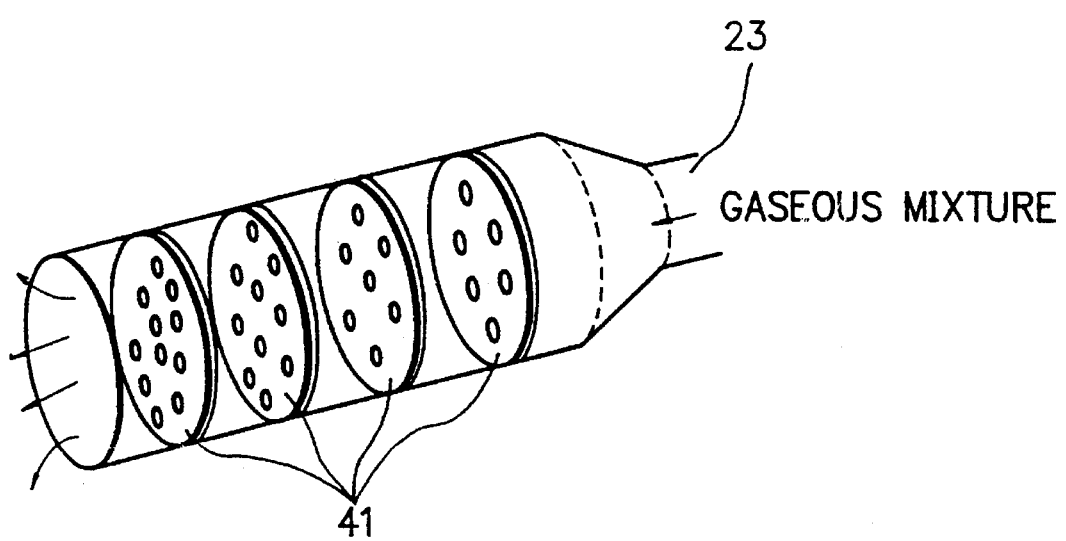
FIG. 5 is a schematic view illustrating the structure of a liquid gasification vessel used in the CVD apparatus shown in FIG. 4.

Now, the liquid gasifying region 4 has a liquid gasifying space A which is integrally communicated with the space C through the upstream side of the gasifying space A. The downstream side of the liquid gasifying space A is integrally communicated with a film deposition space B of a reaction chamber. In the liquid gasifying space A of the liquid gasifying zone 4, there are spacedly arranged a plurality of quartz plates 41 respectively provided with a plurality of perforations. The situation of this is detailed in FIG. 5. As apparent from FIG. 5, the plurality of perforations of each of the quartz plates 41 are arranged such that the gaseous material flown from the space C is allowed to pass through them while being heated and while colliding with the surface of the quartz plate, whereby the gaseous mixture is effectively gasified to produce a gaseous material. The gaseous material is followed by flowing into the film deposition space B of the reaction chamber 5. In the CVD apparatus of this embodiment, the quartz plates 41 may be replaced by insulating ceramic plates.

In FIG. 4, numeral reference 42 indicates an electric heating device which is disposed so as to surround the exterior of the liquid gasifying zone 4 in which the quartz plates 41 are are spacedly arranged. Numeral reference 115 indicates a heat controller equipped with a power source (not shown). The heat controller 115 is electrically connected to the electric heating device 42. The heat controller 115 serves to apply a power in order to actuate the electric heating device 42 while adjusting the quantity of the power applied so that the liquid gasifying space A of the liquid gasifying zone 4 is maintained at a desired temperature.

In the CVD apparatus of this apparatus embodiment, at least one of the quartz plates 41 may be provided with a temperature sensor (not shown) in order to detect the in-plane temperature distribution of the quartz plate. In this case, the heat controller 115 is also electrically connected to the temperature sensor.

As above described, the film deposition space B of the reaction chamber 5 is integrally communicated with the liquid gasifying space A. In the film deposition B, there are spacedly arranged a plurality of substrate holders respectively having a substrate thereon (not shown). Each of the substrate holders has a heating means installed therein (not shown) which serves to heat the sustrate upon film formation. The reaction chamber 5 is provided with an exhaust pipe connected to a vacuum pump (not shown).

Numeral reference 6 indicates a heating device which is disposed so as to surround the exterior of the reaction chamber 5. The heating device 6 serves to facilitate chemical reaction causing the formation of a deposited film on each of the substrates.

Now, the gaseous material flown into the film deposition space B of the reaction chamber 5 from the liquid gasifying space A is chemically reacted with the surface of each of the substrates by the aid of heat radiated from the substrate to cause the formation of a high quality deposited film on each of the substrates at an improved deposition rate.

In the case where the heating device 6 is actuated, the above film-forming chemical reaction is facilitated to further improve the deposition rate of the deposited film.

As above described, the CVD apparatus of this embodiment has a constitution comprising the variable venturi mechanism disposed in the pathway of the carrier gas, the variable venturi mechanism being capable of pulverizing the liquid raw material by the aid of the carrier gas into liquid fine particles while controlling the amount of the liquid raw material to be supplied, wherein a gaseous mixture comprising the liquid fine particles and the carrier gas is produced; the gasifying mechanism capable of gasifying the gaseous mixture to produce a gaseous material; and the reaction chamber capable of subjecting the gaseous material to chemical reaction to cause the formation of a deposited film on an object. Thus, there are provided various advantages such that even in the case of using a liquid raw material of a low saturated vapor pressure, it is efficiently gasified and transported into the reaction chamber, resulting in forming a high quality deposited film on an object with an improved film deposition selectivity and at an improved deposition rate; the mixing ratio between the liquid raw material and the carrier gas can be precisely adjusted as desired; the concentration of the liquid raw material in the gaseous mixture can be adjusted as desired even when the inside temperature of the container is raised; and a high quality deposited film having a flat surface and excelling uniformity can be efficiently formed on an object with an improved film deposition selectivity and at an improved deposition rate.

The CVD apparatus of this embodiment may be modified such that it has a plurality of carrier gas pathways respectively provided with a variable veturi mechanism therein, wherein the pulverization of the liquid raw material into liquid fine particles is concurrently conducted in each of the pathways. In this case, the pathways may be combined into one before the liquid gasifying mechanism.

Alternatively, it is possible to provide the liquid gasifying mechanism at each of the pathways.

Apparatus Embodiment 3

Figure 6:
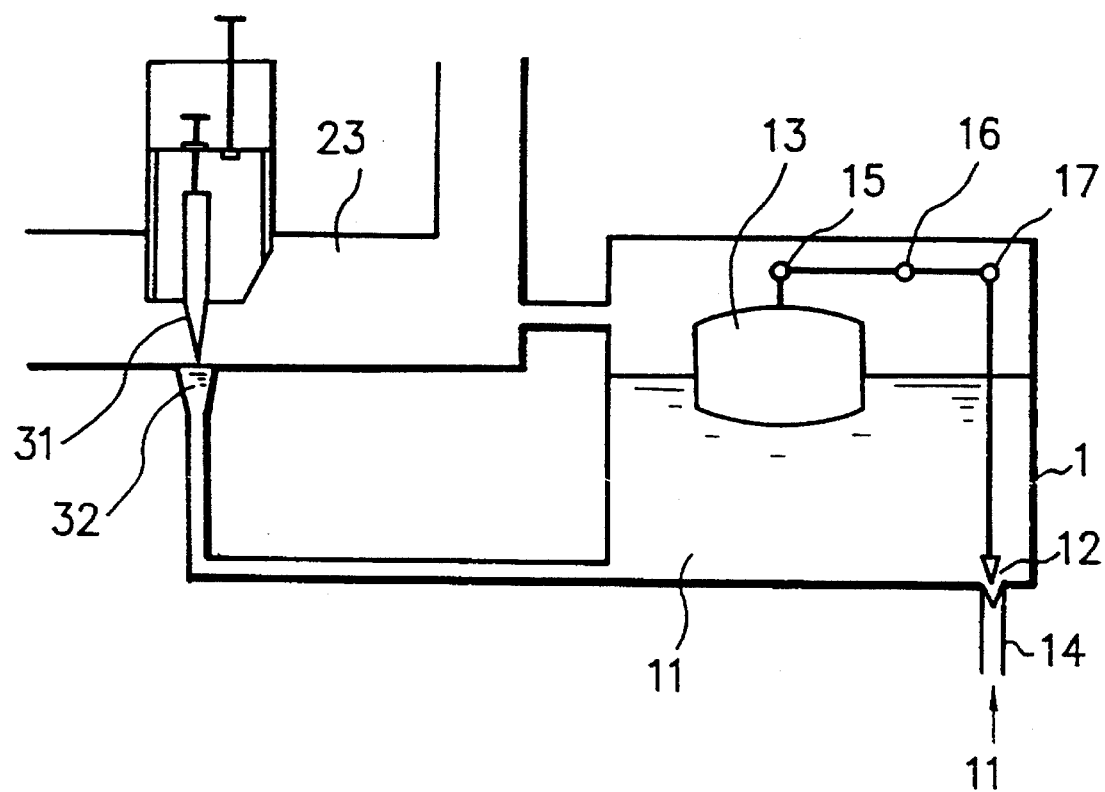
FIG. 6 is a schematic diagram illustrating the constitution of a liquid pulverizing mechanism used in a CVD apparatus according to the present invention.

This apparatus embodiment is to provide a CVD apparatus having the same constitution as that of the CVD apparatus (shown in FIG. 4) described in Apparatus Embodiment 2, except that a mechanism of capable of controlling the liquid level is disposed in the container 1 containing the liquid raw material 11 therein of the CVD apparatus shown in FIG. 4, as shown in FIG. 6.

Therefore, description will be made only of the modified portion of the CVD apparatus shown in FIG. 4 with reference to FIG. 6.

That is, a float 13 is disposed so as to float on the liquid raw material 11 in the container 1 of the CVD apparatus shown in FIG. 4, as shown in FIG. 6.

In FIG. 6, numeral reference 12 indicates a needle valve. Numeral reference 16 indicates a rotary shaft fixed to the container 1. Numeral references 15 and 17 indicate moving rotation axises respectively provided at opposite tips of arms which rotate about the rotary shaft 16 (this mechanism is not shown in the figure). The float 13 is connected to the moving rotation axis 15, and the needle valve is connected to the moving rotation axis 17. Numeral reference 14 indicates a supply pipe which is open into the container 1 and serves to supply the liquid raw material into the container 1.

In this system, the float 13 descends as the liquid level in the container 1 lowers, and the needle valve 12 ascends, wherein the outlet of the supply pipe 14 is opened to supply the liquid raw material into the container 1. When the liquid level in the container 1 is returned to the prescribed level, the needle valve 12 descends to close the outlet of the supply pipe 14, wherein the supply of the liquid raw material into the container 1 is suspended.

The liquid level in the container 1 can be properly set at a desired height by adjusting the length of the arm between the float 13 and the moving rotation axis 15 or the length of the arm between the moving rotation axis 17 and the needle valve 12.

In the CVD apparatus of this embodiment, the float liquid level adjusting mechanism may be replaced by other liquid level adjusting mechanism, for example, comprising a liquid level sensor utilizing electrical contact or an optical liquid level sensor and an electromagnetic valve.

According to the CVD apparatus of this embodiment, the mixing ratio between the flow rate of the carrier gas and the flow rate of the liquid raw material is further improved.

Apparatus Embodiment 4

In this apparatus embodiment, there is illustrated a plurality of CVD apparatus which are of a modification of the liquid gasifying mechanism in each of the CVD apparatus shown in FIGS. 1 and 4.

In each of the CVD apparatus shown in FIGS. 1 and 4, the heating device 105 (see, FIG. 1) or 42 (see, FIG. 4) is disposed on the exterior of the liquid gasifying zone in order to maintain the inside of the gasifying zone, for example, at 80° C. In the case where the gaseous atmosphere in the gasifying zone is not uniformly maintained at a desired temperature, desirable film formation is difficult to be carried as desired.

The present inventors made experimental studies of the interrelation between the inside temperature of the gasifing zone and the transportation efficiency of a gaseous material gasified in the gasifying zone. The results obtained are graphically shown in FIG. 12.

Figure 12:
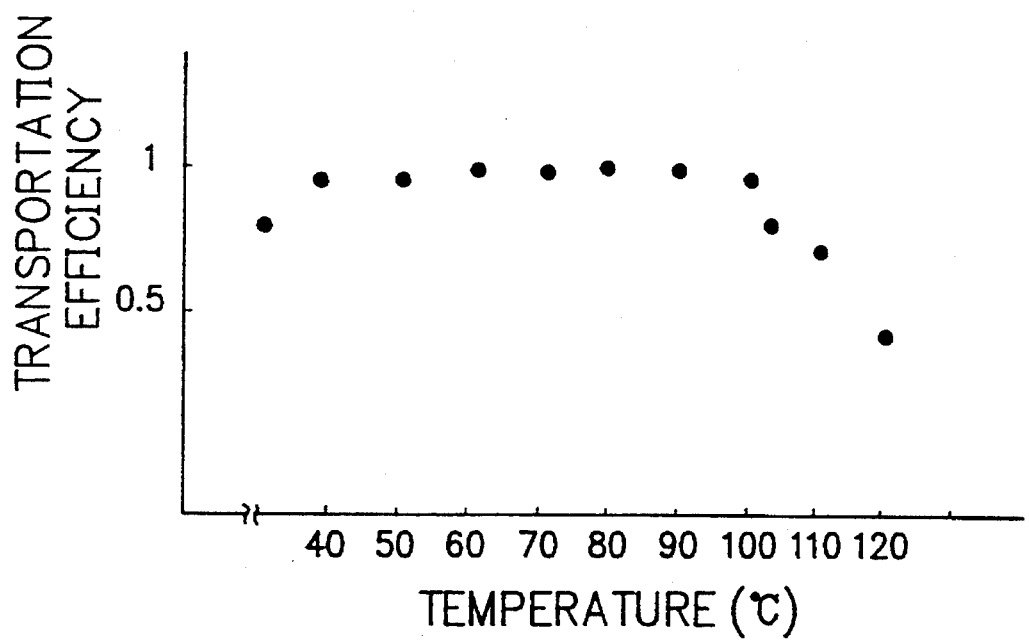
FIG. 12 is a graph showing the interrelation between the inside temperature of a liquid gasification mechanism and the transportation efficiency of a gaseous material gasified in the liquid gasification mechanism.

FIG. 12 is a graph showing the interrelation between the inside temperature of the gasifing zone and the transportation efficiency of a gaseous material gasified in the gasifying zone.

On the basis of the above results, the present inventors found the following facts. That is, (i) in the case of using DMAH as the liquid raw material, when the inside temperature of the gasifying zone in the range of from 40° to 100° C., the liquid raw material is gasified substantially by 100% and the entire resulting gaseous material is transported into the reaction chamber; (ii) in the case where the inside temperature of the gasifying zone is less than 40° C., the liquid raw material is not entirely gasified wherein ungasified liquid raw material is liable to remain as droplets in the gasifying zone; and (iii) in the case where the inside temperature of the gasifying zone is above 100° C., about 0.1% of the liquid raw material is decomposed in the gasifying zone to precipitate Al therein, resulting in filling the perforations of the quartz plates to prevent the gaseous material from flowing toward the reaction chamber, wherein the gas transportation efficiency is markedly reduced.

The present inventors experimentally studied the disadvantage mentioned in the above (iii) influences the formation of a deposited film. That is, using the CVD apparatus shown in FIG. 1, an Al film was deposited on a single crystal Si wafer by introducing DMAH and $H_2$ gas into the system while adjusting the ratio between the flow rate of the DMAH and that of the $H_2$ gas so as to be 2:1 in terms of molar ratio. These procedures were repeated by changing the inside temperature of the gasifying zone in each case. In each film formation, the deposition rate of the Al film was observed. The results obtained are graphically shown in FIG. 13.

Figure 13:
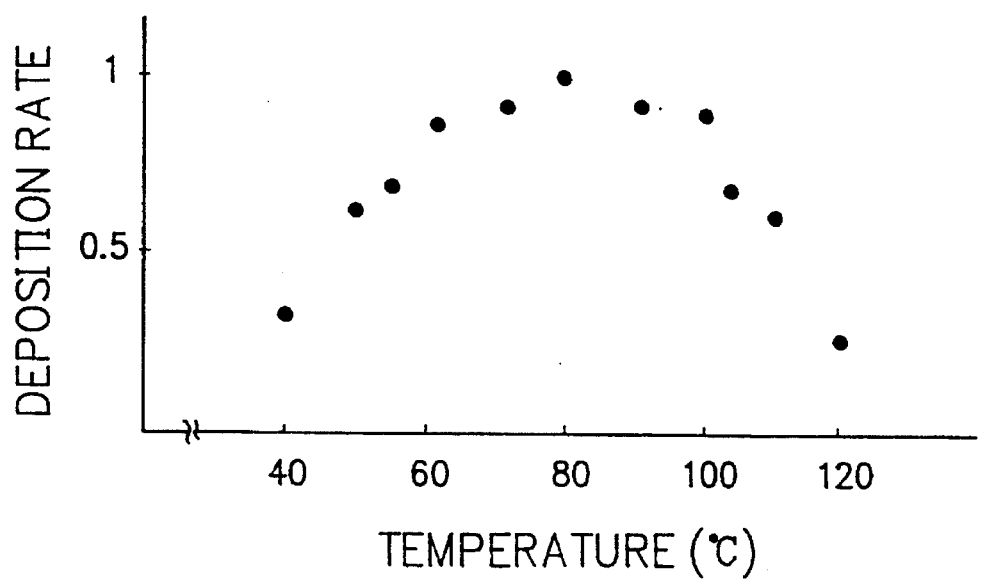
FIG. 13 is a graph showing the interrelation between the inside temperature of a liquid gasification mechanism and the deposition rate of a film in a reaction chamber.

FIG. 13 is a graph showing the interrelation between the inside temperature of the gasifying zone and the deposition rate of an Al film.

The plotted values in FIG. 13 are relative values to the value of the deposition rate of the Al film obtained at 80° C. of the inside temperature of the gasifying zone which is made 1.

On the basis of the above results, the following facts were found. That is, (iv) in the case where the inside temperature of the gasifying zone is lower than 60° C., the vapor pressure of DMAH is excessively lowered, resulting in making the chemical reaction to be in rate-controlling state, wherein the film deposition rate is markedly reduced; (v) in the case where the inside temperature of the gasifying zone exceeds 100° C., the transportation efficiency of a gaseous material gasified in the gasifying zone is markedly lowered resulting in reducing the film deposition rate; (vi) it is an important factor to precisely control the inside temperature of the gasifying zone in the case of conducting the formation of a deposited film by the CVD technique after gasifying a liquid raw material; and (vii) the control of the inside temperature of the gasifying zone is necessary to be precisely performed in a state of gas to be flowing.

Figure 14:
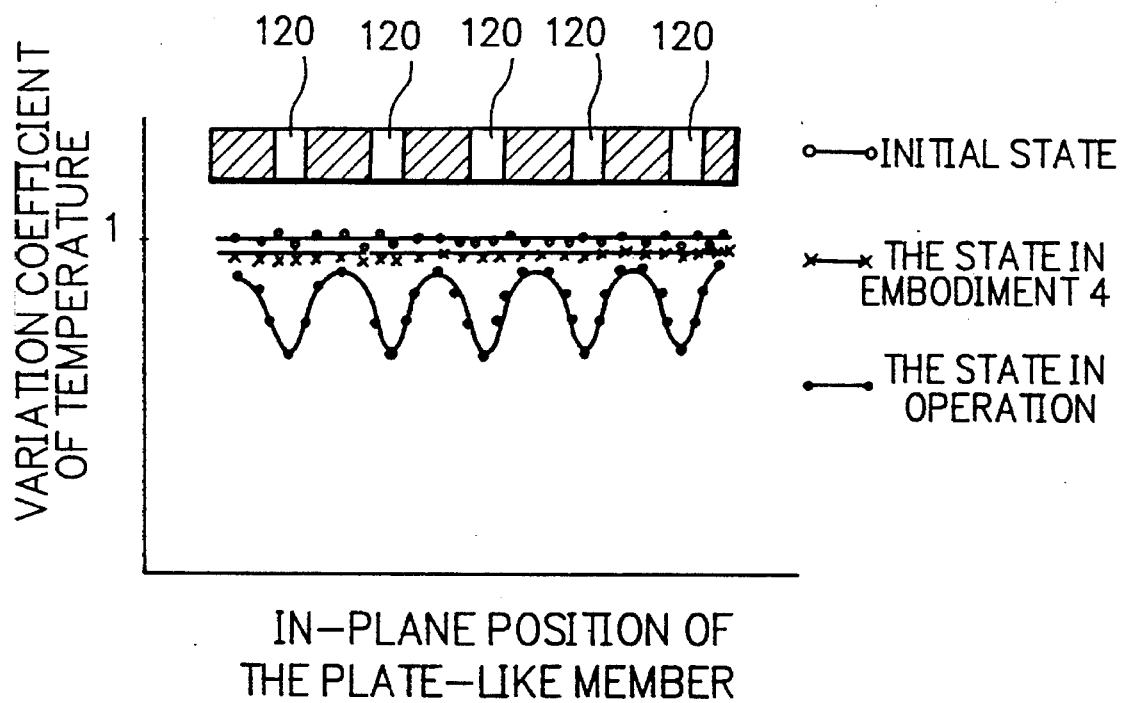
FIG. 14 shows graphs for explaining in-plane temperature distribution states of a quartz plate provided with a plurality of perforations in a liquid gasification mechanism.

FIG. 14 includes a graph showing the experimental results of the in-plane temperature distribution of the quartz plate in a state (that is, the initial state) where no gas was flown (the results are shown by the mark O); a graph showing the experimental results of the in-plane temperature distribution of the quartz plate in a state (that is, in working state) where gas was flown (the results are shown by the mark ●); and a graph showing the experimental results of the in-plane temperature distribution of a liquid gasfication promoting means comprising a quartz plate (provided with a plurality of perforations) provided with a heat generating resistor and a temperature sensor embodied in FIGS. 16 to 22 (which will be later explained) in a state (that is, in working state) where gas was flown (the results are shown by the mark X).

On the basis of the results shown in FIG. 14, it was found that in the vicinity of the perforations 120 of the quartz plate 109, gas efficiently flows without staying and as a result, the in-plane temperature of the quartz plate is lowered than the prescribed temperature; and this is due to the reason that new gas is successively supplied and the gas successively supplied remove heat, resulting in reducing the in-plane temperature of the quartz plate.

It was also found that such in-plane temperature distribution is greatly varied depending upon the size of each of the perforations of the quartz plate; and in general, a change in the in-plane temperature distribution of the quartz plate increases greatly as the proportion of the area comprising the perforations to the entire area of the quartz plate is increased. A further finding was obtained in that in the case of using the liquid gasfication promoting means comprising a quartz plate (provided with a plurality of perforations) provided with a heat generating resistor and a temperature sensor, the temperature in the vicinity of the perforations can be precisely controlled, resulting in making the in-plane temperature distribution uniform as shown in FIG. 14.

Figure 15:
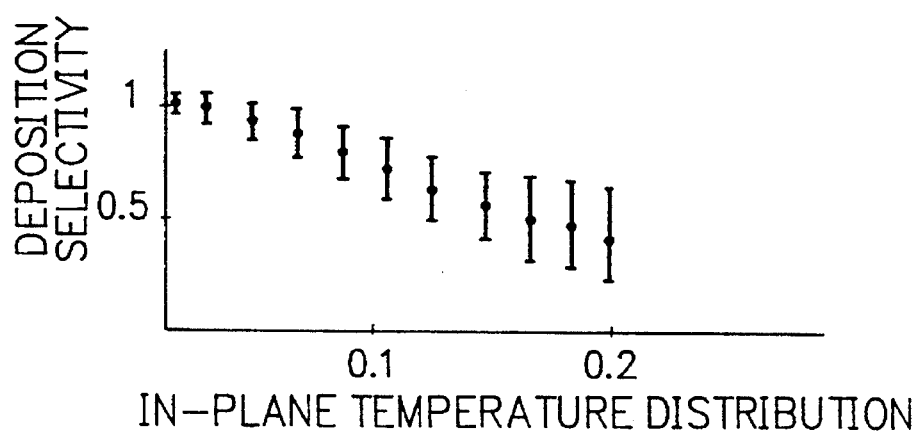
FIG. 15 is a graph showing the interrelation between the in-plane temperature distribution of a quartz plate provided with a plurality of perforation in a gasification mechanism and the deposition selectivity of a film formed on an object in a reaction chamber.

FIG. 15 shows the experimental results of the interrelation between the in-plane temperature distribution of the quartz plate and the deposition selectivity of an Al film on an object.

On the basis of the results shown in FIG. 15, it was found that the deposition selectivity of a film on an object is decreased as the in-plane temperature distribution of the quartz plate is increased.

This apparatus embodiment is to provide a plurality of desirable liquid gasification promoting means in which the in-plane temperature distribution is improved while having a due care about the findings above described.

Figure 16:
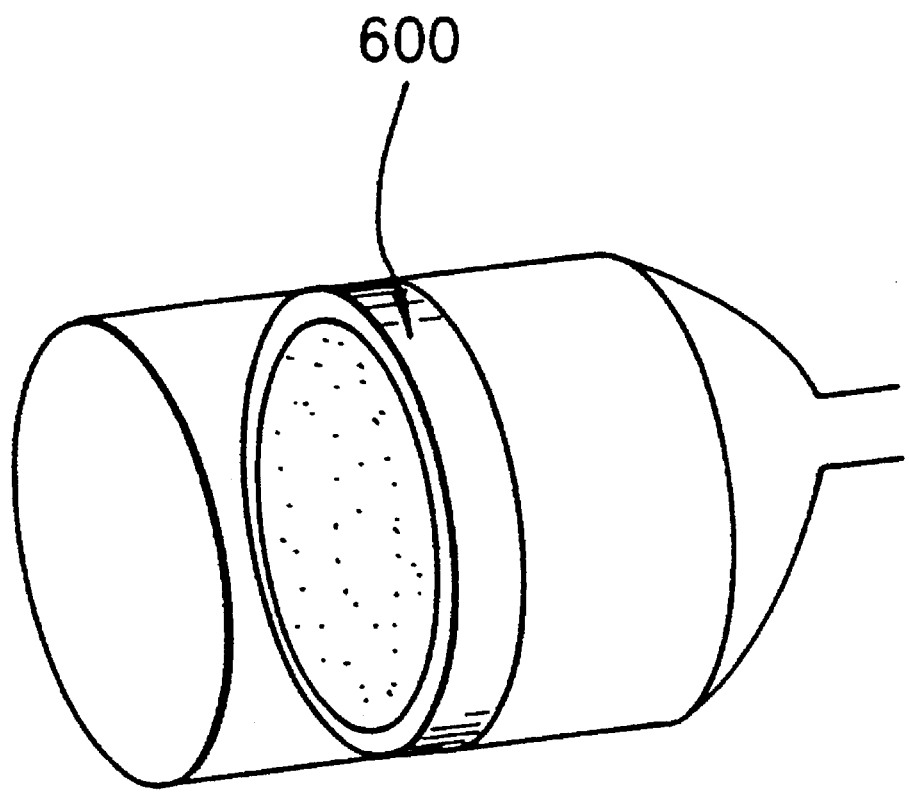
FIG. 16 is a schematic view illustrating the structure of a liquid gasification mechanism used in a CVD apparatus according to the present invention.

FIG. 16 is a schematic view illustrating the structure of an improved liquid gasification promoting means which comprises an assembly 600 comprising a plurality of quartz plates, having a specific structure which is different from the liquid gasification promoting means comprising the plurality of the quartz plates 109 or 41 being spacedly arranged in the case of the CVD apparatus shown in FIG. 1 or FIG. 4.

Figure 17:
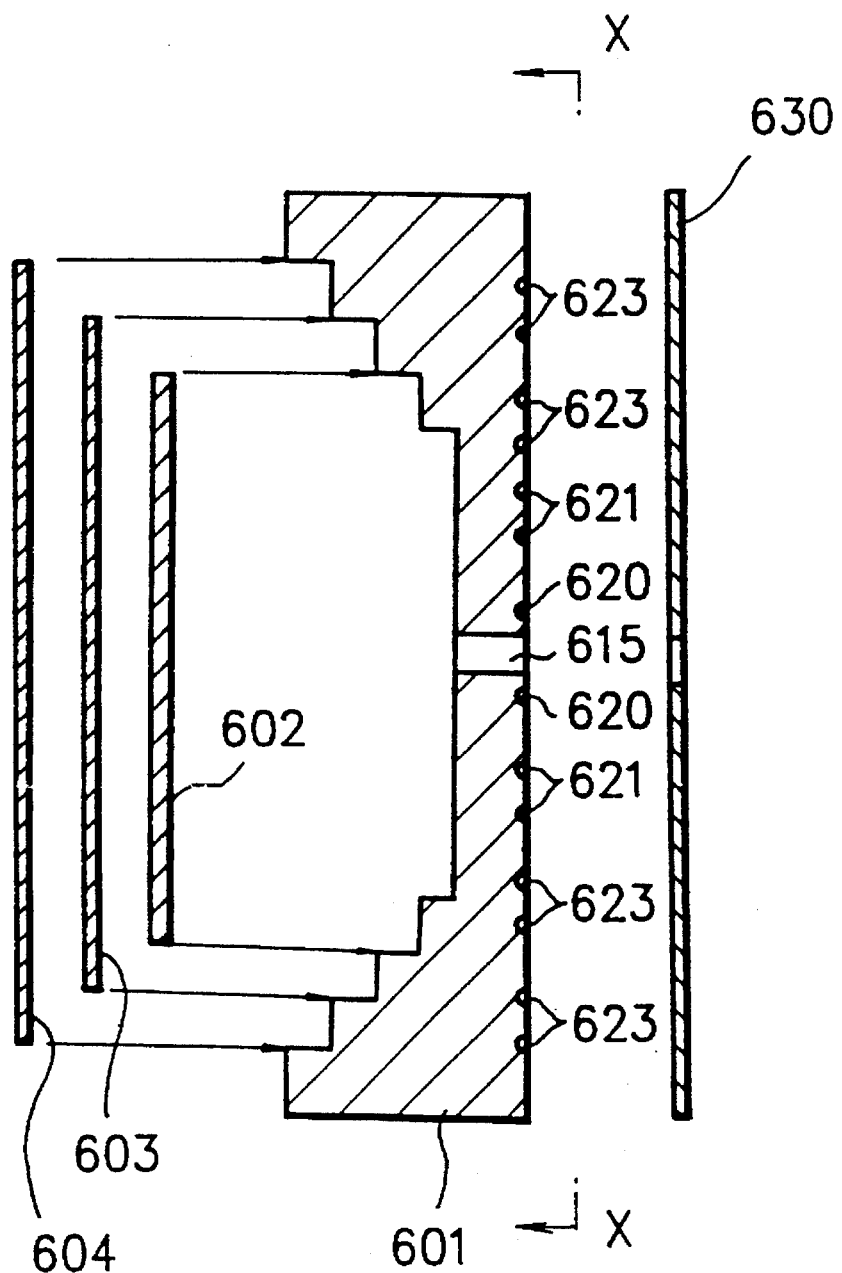
FIG. 17 is a schematic view illustrating the constitution of a gasification promoting means having an assembly comprising a first quartz plate, a second quartz plate and a third quartz plate, respectively provided with a plurality of perforations, being spacedly arranged in sequence, which is used in a CVD apparatus according to the present invention.

FIG. 17 is a schematic explanatory view of the constitution of the assembly 600 shown in FIG. 16.

The structure of the assembly shown in FIG. 17 comprises three different quartz plates i.e. a quartz plate 602, a quartz plate 603 and a quartz plate 604 being horizontally embedded in this order in a holder 601 while leaving a prescribed space between the holder 601 and the quartz plate 602, between the quartz plate 602 and the quartz plate 603, and between the quartz plate 603 and the quartz plate 604, and a quartz plate 630 being disposed on the rear side of the holder 601.

Figure 18:
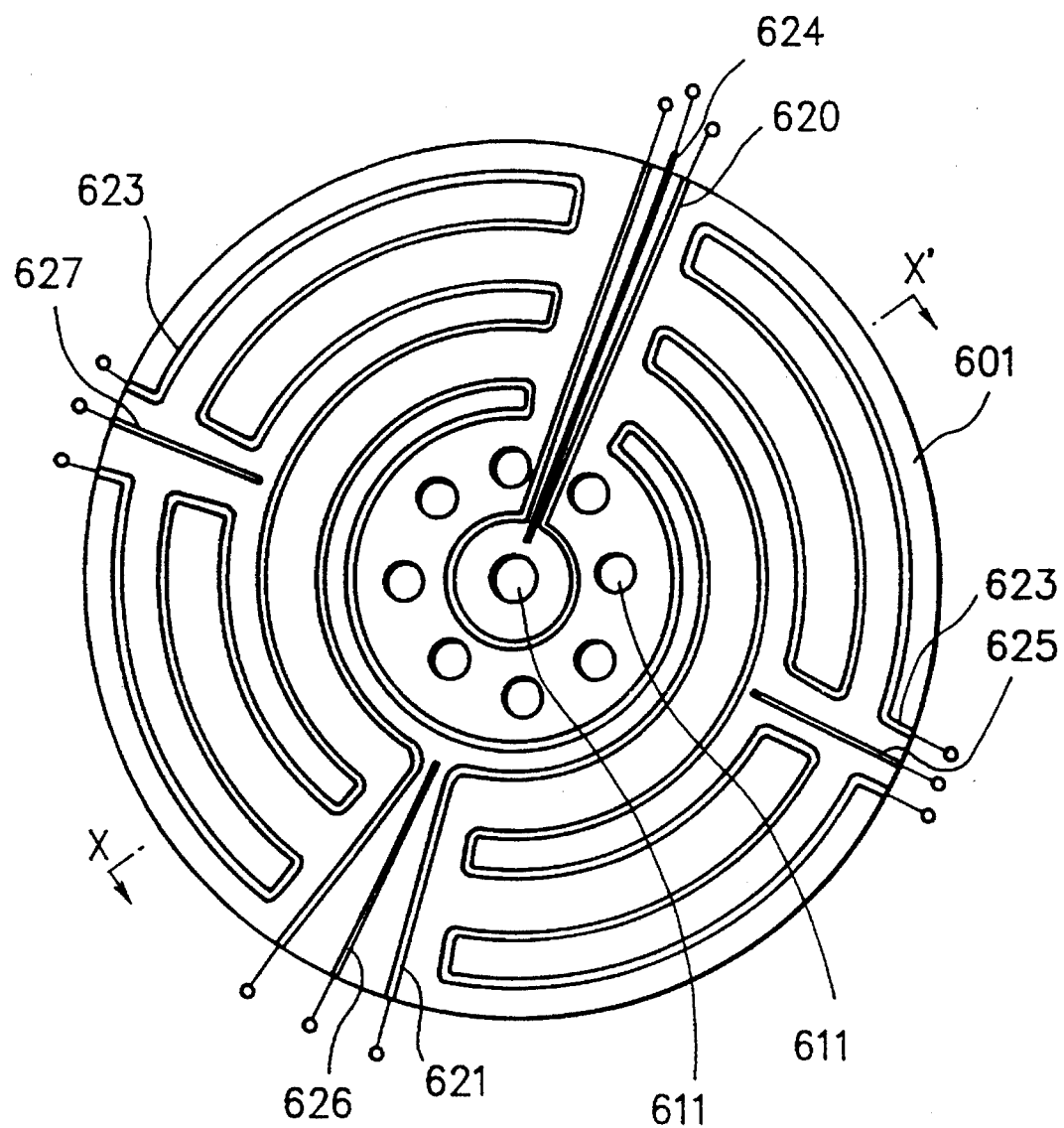
FIG. 18 is a schematic cross-section view, taken along X—X' line in the gasification promoting means shown in FIG. 17.

FIG. 18 is a schematic cross-section view, taken along X—X' line in the liquid gasification promoting means shown in FIG. 17.

As apparent from FIG. 18, the holder 601 is provided with a plurality of heat generating resistors 620, 621 and 623 embedded in the respective grooves. These heat generating resistors are designed such that they can be operated independently of each other. The holder 601 is further provided with four thermo couples 624, 625, 626 and 627 embedded in the respective grooves. These thermo couples are designed such that the in-plane temperature distribution at the corresponding portion can be detected. The holder 601 is provided with a plurality of apertures 611, one of these apertures being positioned at the center as shown in FIG. 18.

Figure 19:
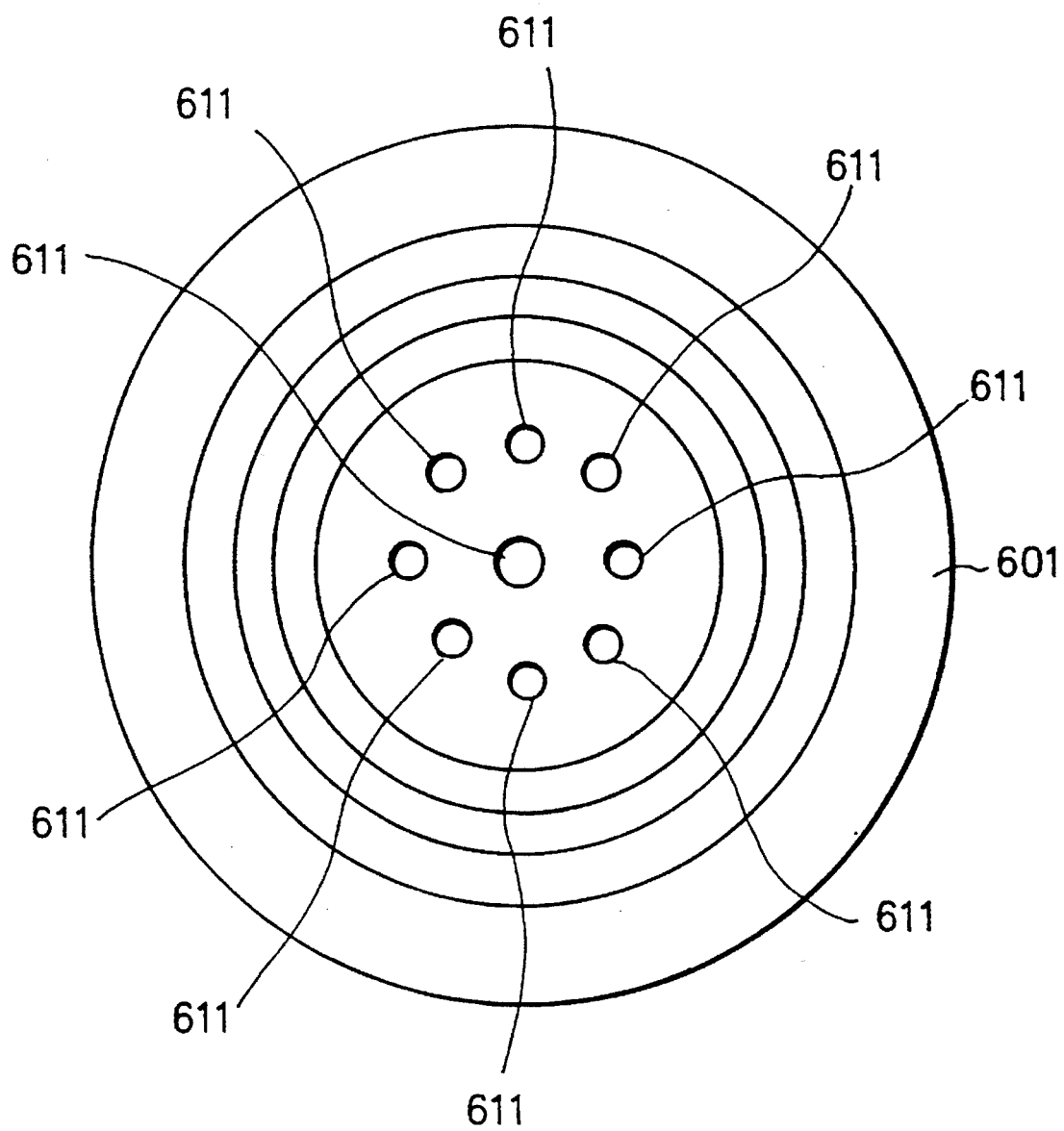
FIG. 19 is a schematic view of the gasification promoting means shown in FIG. 17 when viewed from the side opposite the X—X' line side.
Figure 20:
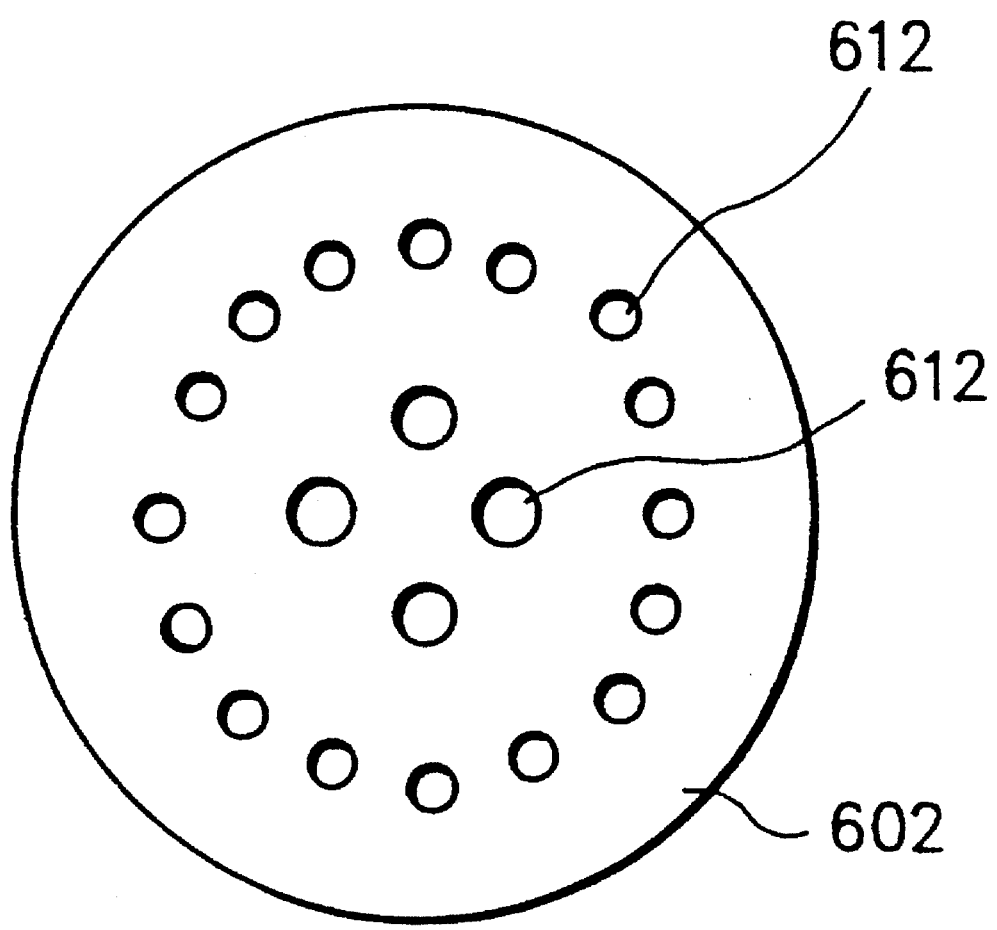
FIG. 20 is a schematic view illustrating the configuration of the first quartz plate in the gasification promoting means shown in FIG. 17.
Figure 21:
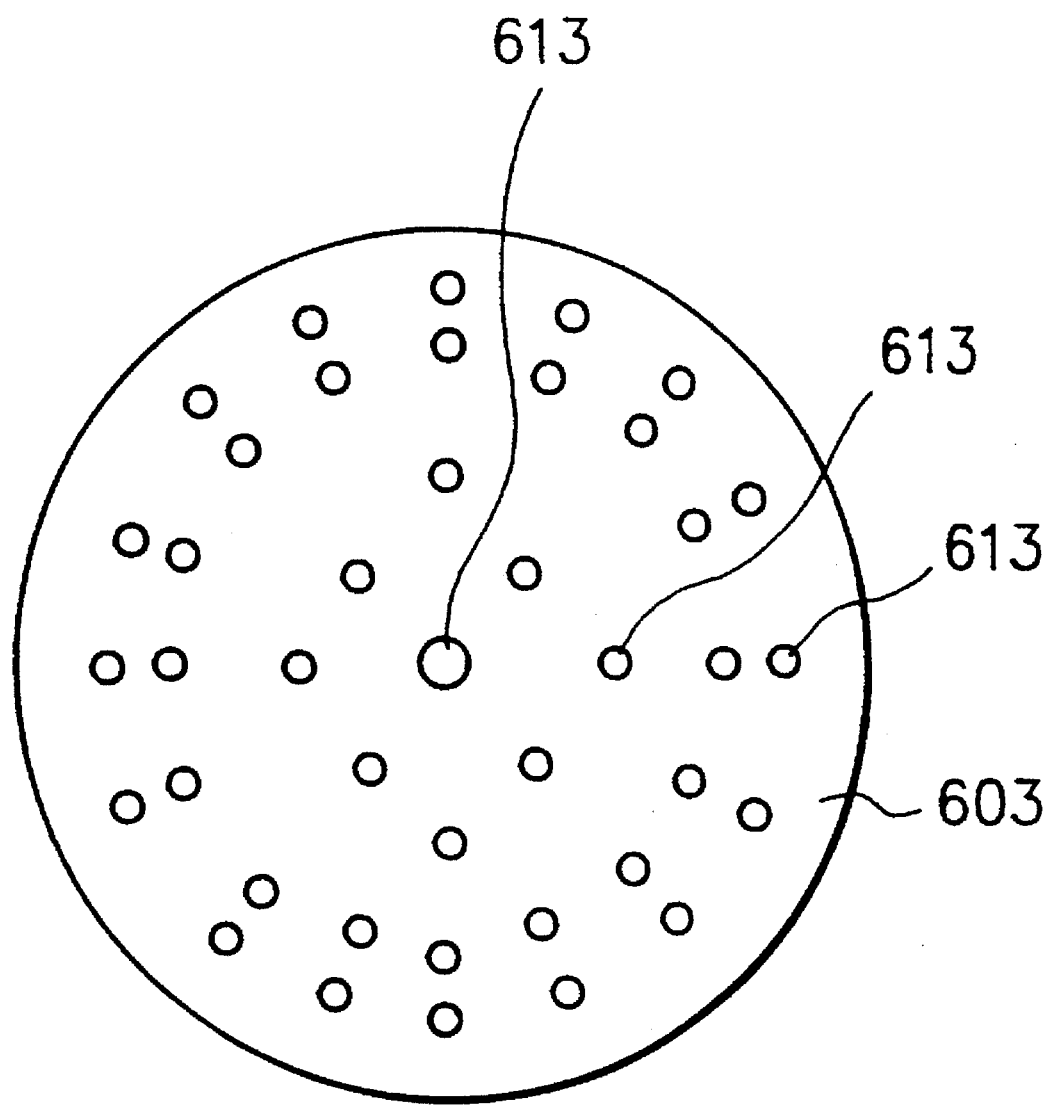
FIG. 21 is a schematic view illustrating the configuration of the second quartz plate in the gasification promoting means shown in FIG. 17.
Figure 22:
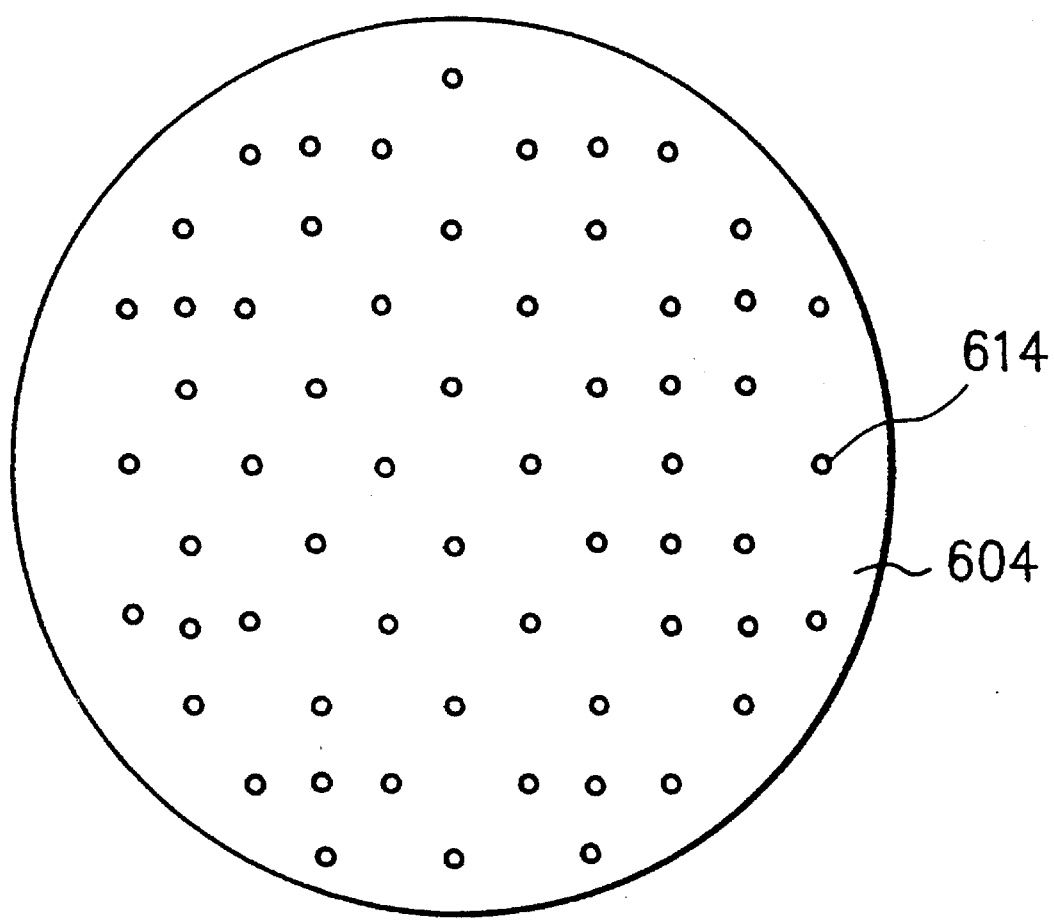
FIG. 22 is a schematic view illustrating the configuration of the third quartz plate in the gasification promoting means shown in FIG. 17.

FIG. 19 is a schematic plan view of the liquid gasification promoting means shown in FIG. 17, viewed from the rear side. FIG. 20 is a schematic cross-section view of the quartz plate 602 of the liquid gasification promoting means shown in FIG. 17. FIG. 21 is a schematic cross-section view of the quartz plate 603 of the liquid gasification promoting means shown in FIG. 17. FIG. 22 is a schematic cross-section view of the quartz plate 604 of the liquid gasification promoting means shown in FIG. 17.

In the above-mentioned gasification promoting means, the quartz plates 602 and 603 are spacedly disposed such that their perforations 612 and 613 are not overlapped with each other. Similarly, the quartz plates 603 and 604 are spacedly disposed such that their perforations 613 and 614 are not overlapped with each other.

As for the size of the perforations of each of the quartz plates 602, 603 and 604, the perforations 612 of the quartz plate 602 are designed to be of a largest size among others. The perforations 614 of the quartz plate 604 are designed to be of a smallest size.

As for the rate of perforated area as to each of the quartz plates 602, 603 and 604, that of the quartz plate 602 is designed to be largest among others, and that of the quartz plate 604 is designed to be smallest.

The present inventors examined the liquid gasification promoting means of this apparatus embodiment by energizing the heat generating resistors while operating the thermo couples to provide a uniform in-plane temperature distribution of about 80° C. in such a state shown by the mark O in FIG. 14, and flowing gas through the liquid gasification promoting means. As a result, there were obtained desirable results with respect to the in-plane temperature distribution shown by the mark X in FIG. 14.

As a result of increasing the power to be supplied in the above procedures, there was obtained an in-plane temperature distribution similar to that shown by the mark O in FIG. 14.

Further, the formation of an Al film using the above liquid gasification promoting means was conducted. As a result, the following facts were found. That is, the inside temperature of the liquid gasifying zone can be uniformly maintained at a desired temperature in the range of from 60° to 100° C. while maintaining the in-plane temperature distribution of each of the quartz plates at a variation of about ±1%, wherein substantially 100% of the gaseous mixture comprising liquid fine particles of the liquid raw material is transported through the liquid gasification promoting means while being efficiently gasified substantially by 100% and the Al film is deposited on an object with an improved film deposition selectivity and at an improved deposition rate.

The advantages of the present invention will be described in more detail by reference to the following film formation examples and comparative film formation examples, which are provided here for illustrative purposes only, and are not intended to limit the scope of the present invention.

Film Formation Example 1

Figure 7A:
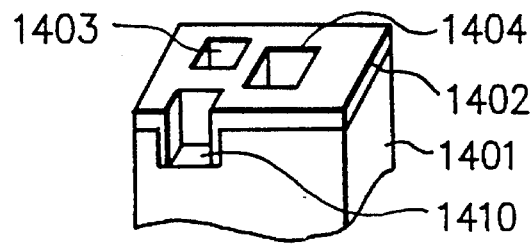
FIGS. 7(A), 7(B), 7(C) and 7(D) are schematic views for explaining the steps of forming a deposited film according to the present invention.

There were prepared ten work chips respectively of the configuration shown in FIG. 7(D) which are usable in the preparation of semiconductor devices (the work chip will be hereinafter referred to as semiconductor work chip) using a single crystal Si substrate of the configuration shown in FIG. 7(A) provided with 1000 apertures in each case, using the CVD apparatus described in Apparatus Embodiment 1.

FIGS. 7(A) through 7(D) are schematic views for explaining the steps of preparing a semiconductor work chip.

Figure 7B:
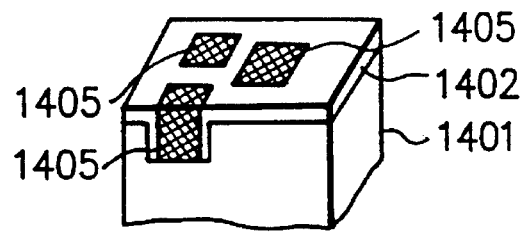
Figure 7C:
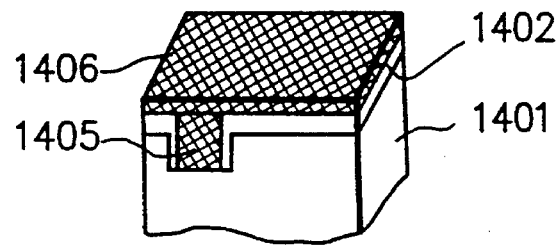

In FIGS. 7(A) through 7(D), numeral reference 1401 indicates a single crystal Si wafer, numeral reference 1402 indicates an insulating film composed of silicon dioxide formed by a thermal oxidation technique, each of numeral references 1403 and 1404 indicates an aperture (an exposed portion in other words), numeral reference 1410 indicates a groove formed at the single crystal Si wafer 1401, numeral reference 1405 (in FIG. 7(B)) indicates an Al film selectively at each of the apertures 1403 and 1404 and the groove 1410, and numeral reference 1406 (in FIG. 7(C)) indicates an Al film on the entire surface of the substrate of FIG. 7(B). In the figures, there are shown only two apertures 1403 and 1404 and only one groove 1410 for the simplification purpose.

Now, there were first provided ten single crystal Si wafers. On each of the ten Si wafers, there was formed a 2.0 μm thick $SiO_2$ film by the conventional thermal oxidation technique. Then, 500 square-shaped apertures 1403 of 0.5 μm in size and 500 square-shaped apertures 1404 of 1.0 μm in size were formed at the $SiO_2$ film by forming resist masks at the predetermined portions of the $SiO_2$ film by the conventional photolithography technique and subjecting the resultant to wet etching. Successively, in each of the apertures 1403 and the apertures 1404, a groove 1410 was formed by subjecting the Si wafer to dry etching, followed by removing the resist masks, and subjecting to thermal oxidation to form a $SiO_2$ film on the exposed inner face of each of the grooves 1410. The resultant was subjected to dry etching to selectively remove the $SiO_2$ film situated at the bottom of each of the grooves. Thus, there were obtained ten first works in process respectively of the configuration shown in FIG. 7(A).

As for each of the resultant ten works in process thus obtained, an Al 1405 (see, FIG. 7(B)) was selectively deposited at each of the apertures 1403 and 1404 and the grooves 1410 using the CVD apparatus described in Apparatus Embodiment 1 (that is, shown in FIG. 1) in the following manner. That is, the inside of the container 101 was made to be under pressure condition by supplying a forcing gas comprising Ar gas into the container containing DMAH at a supply pressure of 400 Torr. The DMAH was supplied into the liquid gasifying zone of the reaction chamber 106 through the liquid supply head 104 at a flow rate of 0.05 cc/min. while pulverizing the DMAH into liquid fine particles, simultaneously with this, $H_2$ gas as the carrier gas was supplied into the liquid gasifying zone at a flow rate of 600 sccm. In this case, the piezoelectric transducer of the supply head 104 was adjusted at a vibration frequency of 50 kHz. The liquid fine particles of the DMAH introduced into the liquid gasifying zone were efficiently gasified by the aid of the $H_2$ gas supplied therein to produce a film-forming raw material gas. In this case, the inside temperature of the gasifying zone was maintained at 90° C. by regulating the heating device 105. The film-forming raw material gas produced in the gasifying zone was followed by flowing into the reaction chamber 106 containing the above ten works in process being spacedly arranged. The inside of the reaction chamber 106 herein had been evacuated to and maintained at 1.0 Torr in advance. Each of the ten works in process disposed on the substrate holders 108 was maintained at 280° C. The film-forming raw material gas introduced into the reaction chamber 106 was chemically reacted with the surface of each of the ten works in process maintained at 280° C. by the aid of heat, wherein an Al was selectively deposited in the apertures 1403 and 1404 and the grooves 1410 of each of the ten works in process. By this, all the apertures 1403 and 1404 and the grooves 1410 of each of the ten works in process were filled up with Al 1405 as shown in FIG. 7(B). Thus, there were obtained ten second works in process respectively of the configuration shown in FIG. 7(B).

The film-forming conditions in this case are collectively shown in Table 1.

As for each of the ten second works in process thus obtained, there was formed a 1 μm thick Al film 1406 so as to cover the entire surface thereof by the conventional sputtering technique wherein an Al target was used.

Thus, there were obtained ten third works in process respectively of the configuration shown in FIG. 7(C).

Finally, as for each of the ten third works in process thus obtained, the Al film 1406 formed thereon was patterned by the conventional pattering technique to form wiring patterns.

Figure 7D:
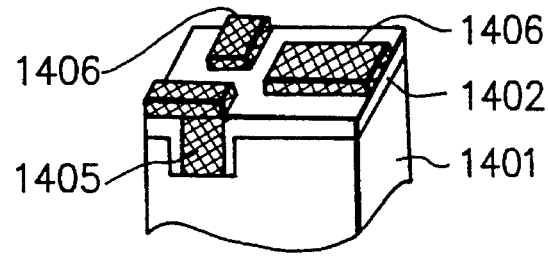

Thus, there were obtained ten semiconductor work chips respectively of the configuration shown in FIG. 7(D).

As for each of the ten semiconductor work chips thus obtained, examination was made of whether or not disconnection was present in the Al-wirings using a tester, wherein a terminal of the tester was attached to the Si wafer 1401 and the other terminal was attached to the Al film 1406.

As a result, all the ten semiconductor work chips were found to be satisfactory in the Al-wirings.

Comparative Film Formation Example 1

Figure 8:
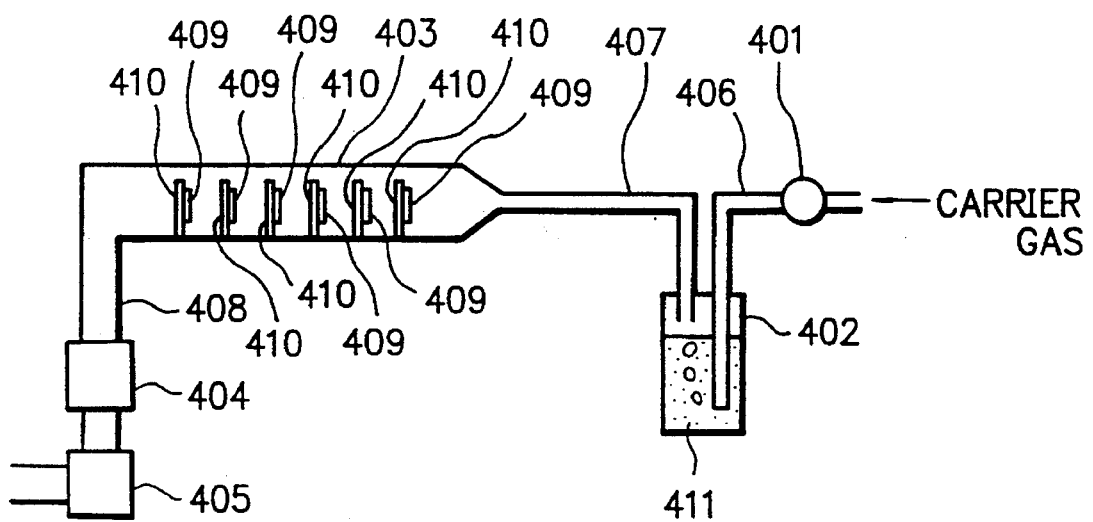
FIG. 8 is a schematic diagram illustrating the constitution of a conventional CVD apparatus.

Ten comparative semiconductor work chips respectively of the configuration shown in FIG. 7(D) were prepared by repeating the procedures of Film Formation Example 1, except for using the conventional CVD apparatus shown in FIG. 8 instead of the CVD apparatus used in Film Formation Example 1, wherein a gaseous material of DMAH was produced by bubbling DMAH contained in the bubbling vessel 402 of the CVD apparatus shown in FIG. 8 with $H_2$ gas.

As for each of the ten semiconductor work chips thus obtained, examination was made of whether or not disconnection was present in the Al-wirings in the same manner as in Film Formation Example 1.

As a result, three of the ten semiconductor work chips were found to have some tens disconnections in their Al-wirings.

Film Formation Examples 2

There were provided provided ten single crystal Si substrates respectively of the configuration shown FIG. 7(A) having 1000 apertures.

Using the ten single crystal Si substrates, ten semiconductor work chips respectively of the configuration shown in FIG. 7(D) were prepared by repeating the procedures of Film Formation Example 1, except that the CVD apparatus used in Film Formation Example 1 was replaced by the CVD apparatus described in Apparatus Embodiment 2, and the formation of an Al film was conducted under the conditions shown in Table 2.

As for each of the ten semiconductor work chips thus obtained, examination was made of whether or not disconnection was present in the Al-wirings in the same manner as in Film Formation Example 1.

As a result, only one of the ten semiconductor work chips was found to have a few disconnections in the Al-wirings.

Film Formation Example 3

As for each of the ten semiconductor work chips obtained in Film Formation Example 1, an about 1.5 μm thick insulating film composed of silicon dioxide was formed thereon using the CVD apparatus described in Apparatus Embodiment 1.

For the formation of the insulating film, there were used TEOS as the liquid raw material and $O_3$ gas as the reactive gas.

As for each of the ten resultants, the state of step coverage was observed.

As a result, each of the ten resultants was found to excel in step coverage in spite of the thin insulating film being about 1.5 μm.

Film Formation Example 4

As for each of the ten semiconductor work chips obtained in Film Formation Example 2, an about 1.5 μm thick insulating film composed of silicon dioxide was formed thereon using the CVD apparatus described in Apparatus Embodiment 2.

For the formation of the insulating film, there were used TEOS as the liquid raw material and $O_3$ gas as the reactive gas.

As for each of the ten resultants, the state of step coverage was observed.

As a result, each of the ten resultants was found to excel in step coverage in spite of the thin insulating film being about 1.5 μm.

As apparent from what above described, the present invention, any of the film-forming liquid raw materials, even if it is one that provides an extremely low vapor pressure at normal temperature, can be gasified to produce a desirable gaseous material in a state capable of causing the formation of a high quality deposited film in the foregoing liquid gasification mechanism, wherein the film-forming liquid raw material is pulverized into liquid fine particles in the foregoing liquid pulverizing mechanism while precisely adjusting the amount of the film-forming liquid raw material to be supplied thereinto, followed by flowing the liquid fine particles into the liquid gasification mechanism wherein the liquid fine particles are efficiently gasified to produce the film-forming gaseous material without causing ungasified residue. And the film-forming gaseous material produced in the liquid gasification mechanism is successively transported to the film-forming space with an improved transportaion efficiency, wherein the formation of a high quality deposited film is caused on an object at an improved deposition rate. According to the present invention, the complicated parameters upon forming a deposited film by the conventional CVD technique using a film-forming liquid raw material are markedly simplified. And the CVD tech-

TABLE 1

| file forming parameters | preset value |
| --- | --- |
| pressure of forced gas (Ar gas) (Torr) | 400 |
| flow rate of DMAH (cc/minute) | 0.05 |
| flow rate of carrier gas ($H_2$) (SCCM) | 600 |
| inner pressure of reaction chamber (Torr) | 1.00 |
| substrate temperature (°C.) | 280 |
| inside temperature of the liquid gasifying system (°C.) | 90 |

TABLE 2

| film forming parameters | preset value |
| --- | --- |
| flow rate of DMAH (cc/minute) | 0.05 |
| flow rate of carrier gas ($H_2$) (SCCM) | 500 |
| inner pressure of reaction chamber (Torr) | 1.20 |
| substrate temperature (°C.) | 300 |
| inside temperature of the liquid gasifying system (°C.) | 80 |

What we claim is:

1. A chemical vapor deposition method for forming a deposited film on a substrate using a film-forming liquid raw material, said chemical vapor deposition method comprises:

supplying said film-forming liquid raw material while regulating the amount of said film-forming liquid raw material into a liquid gasifying system comprising a liquid atomizing mechanism and a liquid gasifying mechanism provided with a plurality of plate-like shaped heating members respectively having a plurality of perforations; simultaneously supplying a gas into said liquid gasifying system while controlling the flow rate of said gas, wherein said film-forming liquid raw material is atomized into liquid fine particles which are heated together with said gas while being passed through said perforations of said plurality of plate-like shaped heating members while controlling the temperature of the heating members to produce a film-forming raw material gas;

introducing said film-forming raw material gas from said gasifying system into a reaction chamber; and chemically reacting said film-forming raw material gas with a surface of a substrate disposed in said reaction chamber, said substrate being maintained at a temperature, sufficient to thereby cause the formation of a deposited film on said surface of said substrate.

2. A chemical vapor deposition method according to claim 1, wherein at least one of the plurality of heating members is provided with a heat generating resistor.

3. A chemical vapor deposition method according to claim 1, wherein said chemical vapor deposition method is conducted so as to satisfy the equation: $T_1 < T_2 < T_3$, with $T_1$ being a temperature of the film-forming liquid raw material upon supplying into the liquid gasifying system, $T_2$ being a temperature of the heating member upon gasifying the liquid fine particles, and $T_3$ being a temperature of the substrate upon film formation.

4. A chemical vapor deposition method according to claim 1, wherein the film-forming raw material is one or more members selected from the group consisting of organometallic compounds.

5. A chemical vapor deposition method according to claim 4, wherein the organometallic compounds are alkylaluminum hydrides.

6. A chemical vapor deposition method according to claim 4, wherein the gas is $H_2$ gas.

7. A chemical vapor deposition method according to claim 6, wherein the deposited film formed on the substrate is a deposited film containing aluminum as the main constituent.

8. A chemical vapor deposition method according to claim 1, wherein the film-forming raw material gas is one or more members selected from the group consisting of organic silane compounds.

9. A chemical vapor deposition method according to claim 8, wherein the gas is $O_3$ gas.

10. A chemical vapor deposition method according to claim 9, wherein the deposited film formed on the substrate is a silicon oxide film.

11. A chemical vapor deposition method for forming a deposited film on a substrate, said chemical vapor deposition method comprises:

(a) supplying a film-forming raw material in the liquid state into a gasifying system integrally provided with a plurality of plate-like shaped heating members respectively having a plurality of perforations, a plurality of heat regulators regulating the amount of said film-forming raw material and thermodetectors;

(b) supplying a gas reactive with said film-forming raw material into said gasifying system while regulating the flow rate of said gas;

(c) introducing said film-forming raw material and said gas from said gasifying system into a reaction chamber having a substrate disposed therein while heating said film-forming raw material and said gas by passing said film-forming raw material and said gas through said perforations of said plurality of plate-like shaped heating members while controlling the temperature of said film-forming raw material and said gas at a desired value by means of said heat regulators and said thermo detectors and while gasifying said film-forming raw material into a gaseous state; and (d) chemically reacting said gasified film-forming raw material and said gas introduced into said reaction chamber to cause the formation of a deposited film on said substrate maintained at a reaction temperature in said reaction chamber.

12. A chemical vapor deposition method according to claim 11, wherein the film-forming raw material is one or more members selected from the group consisting of alkylaluminum hydrides and the gas is $H_2$ gas.

* * * * *

UNITED STATES PATENT AND TRADEMARK OFFICE
CERTIFICATE OF CORRECTION

PATENT NO. : 5,547,708
DATED : August 20, 1996
INVENTOR(S) : TETSUO ASABA ET AL.

It is certified that error appears in the above-identified patent and that said Letters Patent is hereby corrected as shown below:

In the Drawing:

SHEET 10 OF 19

Figure 11:
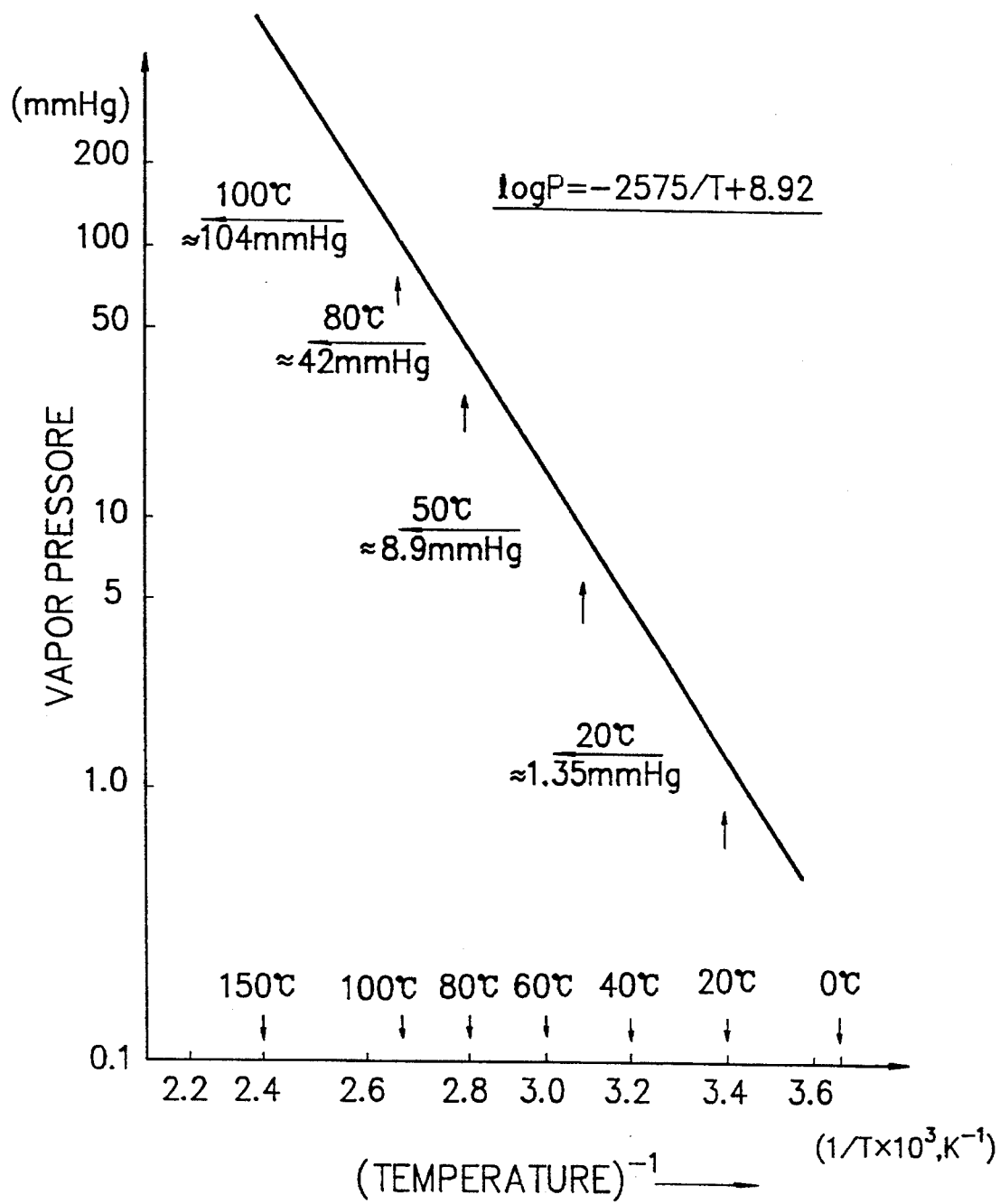
FIG. 11 is a graph showing the temperature dependency of the saturated vapor pressure of DMAH.

FIG. 11, "VAPOR PRESSORE" should read --VAPOR PRESSURE--.

COLUMN 1

Line 15, "diskes," should read --disks,--.
Line 27, "formed" should read --formed in--.

COLUMN 2

Line 45, "als.," should read --al.,--.
Line 50, "INNTERCONNECTION"," should read
        --INTERCONNECTION",--.

COLUMN 3

Figure 9A:
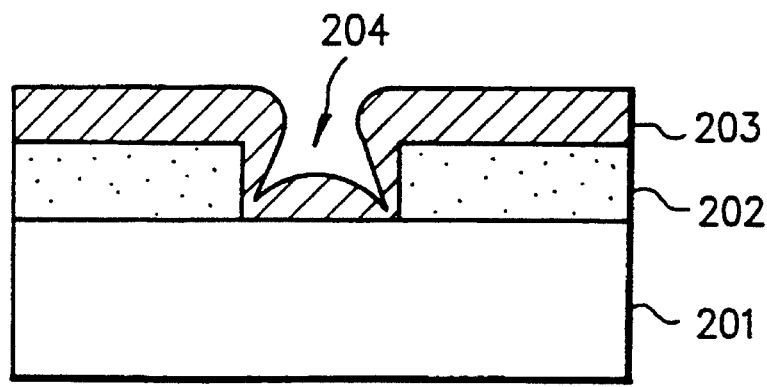
FIGS. 9(a) and 9(b) are schematic explanatory views respectively illustrating a stacked configuration formed by means of a sputtering technique.
Figure 9B:
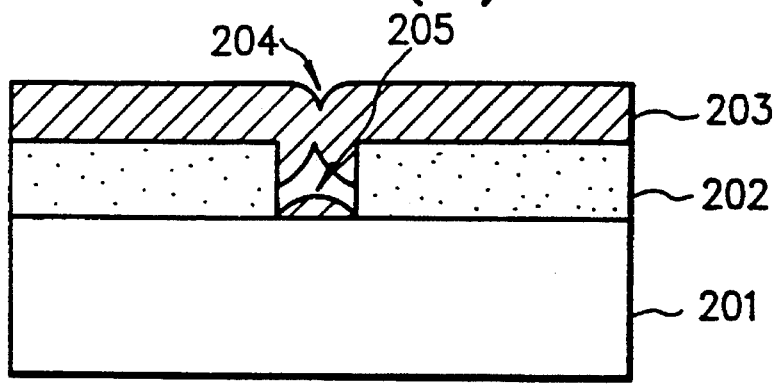
Figure 9C:
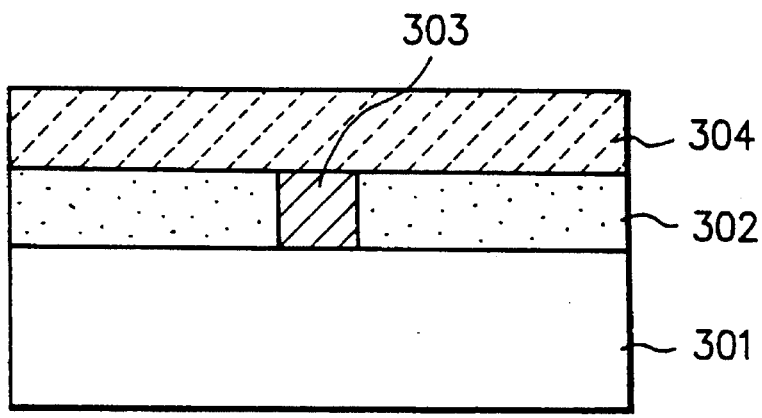
FIG. 9(c) is a schematic explanatory view illustrating a stacked configuration formed utilizing the selective deposition by the conventional CVD method.
Figure 10:
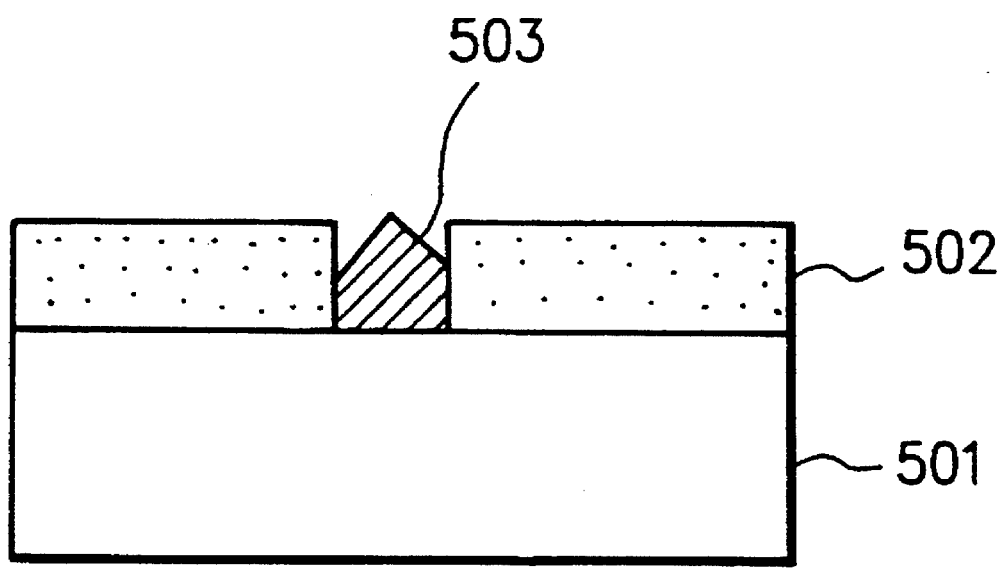
FIG. 10 is a schematic view schematically showing the surface state of an aluminum selectively deposited by the conventional CVD method.

Line 8, "becomes" should read --comes--.
Line 12, "becomes" should read --comes--.
Line 24, "indicates-a" should read --indicates a--.
Line 33, "are" should be deleted, and
        "occurrs" should read --occurs--.
Line 35, "what shown" should be deleted.
Line 36, "in FIG. 9" should read --FIG. 9,--.
Line 38, "occurrs" should read --occurs--.
Line 60, "into" should read --in--.

UNITED STATES PATENT AND TRADEMARK OFFICE
CERTIFICATE OF CORRECTION

PATENT NO.   : 5,547,708
DATED        : August 20, 1996
INVENTOR(S)  : TETSUO ASABA ET AL.

It is certified that error appears in the above-identified patent and that said Letters Patent is hereby corrected as shown below:

COLUMN 4

Line 13, "proceeds" should read --proceed--.
        Line 31, "method" (second occurrence) should read
                 --apparatus--.
        Line 54, "defect" should read --defects--.
        Line 59, "defect" should read --defects--.

COLUMN 5

Line 59, "becomes" should read --comes--.
        Line 63, "embeded" should read --embedded--.

COLUMN 6

Line 5, "embeded" should read --embedded--.
        Line 7, "a" (second occurrence) should read --an--.
        Line 36, "ration" should read --ratio--.
        Line 37, "to control" should read --to be controlled--.
        Line 38, "necessary" should read --necessarily--.
        Line 39, "to" should read --to be--.
        Line 43, "termes" should read --terms--.
        Line 56, "termes" should read --terms--.

COLUMN 7

Line 14, "what" should read --what has been--.
        Line 46, "a due regard on" should read --due regard to--.

UNITED STATES PATENT AND TRADEMARK OFFICE
CERTIFICATE OF CORRECTION

PATENT NO. : 5,547,708
DATED : August 20, 1996
INVENTOR(S) : TETSUO ASABA ET AL.

Page 3 of 6

It is certified that error appears in the above-identified patent and that said Letters Patent is hereby corrected as shown below:

COLUMN 8

Line 2, "and" should read --and as--.
Line 3, "becomes" should read --comes--.
Line 4, "in addition" should be deleted.

COLUMN 10

Line 52, "be transported." should read --transport.--.
Line 67, "example" should read --examples of--.

COLUMN 11

Line 7, "SION," should read --SiON,--.
Line 38, "raw" should read --raw material--.
Line 43, "of gas" should read --the gas is--.
Line 47, "of" (second occurrence) should be deleted.
Line 50, "Jetting" should read --jetting-.

COLUMN 12

Line 2, "as to" should read --in--.
Line 21, "Jetting" should read --jetting--.
Line 47, "Jetting" should read --jetting--.

COLUMN 13

Line 63, "107" should read --108--.
Line 64, "108" should read --107--.

UNITED STATES PATENT AND TRADEMARK OFFICE
CERTIFICATE OF CORRECTION

PATENT NO. : 5,547,708
DATED : August 20, 1996
INVENTOR(S) : TETSUO ASABA ET AL.        Page 4 of 6

It is certified that error appears in the above-identified patent and that said Letters Patent is hereby corrected as shown below:

COLUMN 14

Line 1, "what" should read --what is--.
Line 23, "Jetting" should read --jetting--.
Line 46, "flown" should read --flowed--.
Line 50, "composed" should read --composed of--.
Line 59, "flown" should read --flowed--.

COLUMN 16

Line 16, "are" should read --is-.
Line 47, "is=0," should read --is = 0,--.

COLUMN 17

Line 9, "are" (second occurrence) should be deleted.
Line 29, "sustrate" should read --substrate--.

COLUMN 18

Line 20, "of" (first occurrence) should be deleted.
Line 33, "axises" should read --axes--.
Line 55, "other" should read --another--.

COLUMN 19

Line 8, "be" should be deleted.
Line 9, "ried" should read --ry out--.
Line 16, "gasifing" should read --gasifying--.

UNITED STATES PATENT AND TRADEMARK OFFICE
CERTIFICATE OF CORRECTION

PATENT NO. : 5,547,708
DATED : August 20, 1996
INVENTOR(S) : TETSUO ASABA ET AL.

It is certified that error appears in the above-identified patent and that said Letters Patent is hereby corrected as shown below:

COLUMN 20

Line 2, "necessary" should read --necessarily--.
Line 12, "gasfication" should read --gasification--.
Line 20, "lowered" should read --lower--.
Line 23, "remove" should read --removes--.

COLUMN 23

Line 30, "pattering" should read --patterning--.
Line 57, "tens" should read --tens of--.
Line 62, "provided" (second occurrence) should be deleted.

COLUMN 24

Line 45, "what" should read --what has been--, and "the" should read --in the--.
Line 62, "portaion" should read --portation--.

COLUMN 25

Line 5, "file" should read --film--.

Line 48, "ture," should read --ture--.

UNITED STATES PATENT AND TRADEMARK OFFICE
CERTIFICATE OF CORRECTION

PATENT NO. : 5,547,708
DATED : August 20, 1996
INVENTOR(S) : TETSUO ASABA ET AL.

Page 6 of 6

It is certified that error appears in the above-identified patent and that said Letters Patent is hereby corrected as shown below:

COLUMN 26

Line 45, "thermo" should read --thermo- --.

Signed and Sealed this

Fourth Day of March, 1997

Attest:

BRUCE LEHMAN

Attesting Officer

Commissioner of Patents and Trademarks